United States Patent
AlSinan et al.

(10) Patent No.: US 12,204,061 B2
(45) Date of Patent: Jan. 21, 2025

(54) METHOD AND SYSTEM FOR DETERMINING COARSENED GRID MODELS USING MACHINE-LEARNING MODELS AND FRACTURE MODELS

(71) Applicants: SAUDI ARABIAN OIL COMPANY, Dhahran (SA); King Abdullah University of Science and Technology, Thuwal-Jeddah (SA)

(72) Inventors: Marwah Mufid AlSinan, Al Qatif (SA); Xupeng He, Thuwal (SA); Hyung Tae Kwak, Dhahran (SA); Hussein Hoteit, Thuwal (SA)

(73) Assignees: SAUDI ARABIAN OIL COMPANY, Dhahran (SA); King Abdullah University of Science and Technology, Thuwal-Jeddah (SA)

( * ) Notice: Subject to any disclaimer, the term of this patent is extended or adjusted under 35 U.S.C. 154(b) by 769 days.

(21) Appl. No.: 17/491,002

(22) Filed: Sep. 30, 2021

(65) Prior Publication Data
US 2023/0097859 A1    Mar. 30, 2023

(51) Int. Cl.
*G01V 20/00*   (2024.01)
*E21B 43/267*  (2006.01)
(Continued)

(52) U.S. Cl.
CPC .......... *G01V 20/00* (2024.01); *E21B 43/267* (2013.01); *G06F 30/20* (2020.01); *G06N 3/045* (2023.01);
(Continued)

(58) Field of Classification Search
CPC ........ G01V 20/00; G06F 30/20; G06N 3/045; G06N 3/08; E21B 43/267; E21B 2200/20
See application file for complete search history.

(56) References Cited

U.S. PATENT DOCUMENTS 6,928,367 B2   8/2005  Gray et al.
8,731,889 B2   5/2014  Du et al.
(Continued)

FOREIGN PATENT DOCUMENTS

CN   111832227 A   10/2020

OTHER PUBLICATIONS

Santoso R, He X, Hoteit H. Application of machine-learning to construct simulation models from high-resolution fractured formation. InAbu Dhabi International Petroleum Exhibition and Conference Nov. 11, 2019 (p. D021S060R004). SPE. (Year: 2019).*

(Continued)

*Primary Examiner* — Chuen-Meei Gan
(74) *Attorney, Agent, or Firm* — Osha Bergman Watanabe & Burton LLP

(57) ABSTRACT

A method may include obtaining fracture image data regarding a geological region of interest. The method may further include determining various fractures in the fracture image data using a first artificial neural network and a pixel-searching process. The method may further include determining a fracture model using the fractures, a second artificial neural network, and borehole image data. The method may further include determining various fracture permeability values using the fracture model and a third artificial neural network. The method may further include determining various matrix permeability values for the geological region of interest using core sample data. The method may further include generating a coarsened grid model for the geological region of interest using a fourth artificial neural network, the matrix permeability values, and the fracture permeability values.

12 Claims, 11 Drawing Sheets

(51) Int. Cl.
<table>
<tr><td>G06F 30/20</td><td>(2020.01)</td></tr>
<tr><td>G06N 3/045</td><td>(2023.01)</td></tr>
<tr><td>G06N 3/08</td><td>(2023.01)</td></tr>
<tr><td>G06V 10/46</td><td>(2022.01)</td></tr>
<tr><td>G06V 20/17</td><td>(2022.01)</td></tr>
</table>

(52) U.S. Cl.
CPC ............. *G06N 3/08* (2013.01); *G06V 10/462* (2022.01); *G06V 20/17* (2022.01); *E21B 2200/20* (2020.05)

(56) References Cited

U.S. PATENT DOCUMENTS

<table>
<tr><td>11,073,006</td><td>B2*</td><td>7/2021</td><td>Hoeink</td><td>G01V 1/46</td></tr>
<tr><td>2002/0013687</td><td>A1</td><td>1/2002</td><td>Ortoleva et al.</td><td></td></tr>
<tr><td>2007/0016389</td><td>A1*</td><td>1/2007</td><td>Ozgen</td><td>G01V 20/00<br>703/10</td></tr>
<tr><td>2010/0250216</td><td>A1</td><td>9/2010</td><td>Narr et al.</td><td></td></tr>
<tr><td>2017/0145793</td><td>A1</td><td>5/2017</td><td>Ouenes</td><td></td></tr>
<tr><td>2018/0010429</td><td>A1</td><td>1/2018</td><td>Willberg et al.</td><td></td></tr>
<tr><td>2018/0202266</td><td>A1</td><td>7/2018</td><td>Holland et al.</td><td></td></tr>
<tr><td>2019/0026405</td><td>A1</td><td>1/2019</td><td>Ramsay et al.</td><td></td></tr>
<tr><td>2019/0383965</td><td>A1</td><td>12/2019</td><td>Salman et al.</td><td></td></tr>
<tr><td>2021/0097390</td><td>A1</td><td>4/2021</td><td>Liang et al.</td><td></td></tr>
<tr><td>2021/0131249</td><td>A1</td><td>5/2021</td><td>Singh et al.</td><td></td></tr>
<tr><td>2021/0231011</td><td>A1</td><td>7/2021</td><td>Ruhle et al.</td><td></td></tr>
<tr><td>2021/0239869</td><td>A1</td><td>8/2021</td><td>Beam et al.</td><td></td></tr>
</table>

OTHER PUBLICATIONS

He X, Santoso R, Hoteit H. Application of machine-learning to construct equivalent continuum models from high-resolution discrete-fracture models. InInternational Petroleum Technology Conference Jan. 13, 2020 (p. D031S075R003). IPTC. (Year: 2020).*

Weinzierl, Wolfgang, et al., "Deep Learning a Poro-Elastic Rock Physics Model for Pressure and Saturation Discrimination", Geophysics, Jan. 1, 2021 (14 pages).

Jiang, Jiamin, et al., "An improved projection-based embedded discrete fracture model (pEDFM) for multiphase flow in fractured reservoirs", Advances in Water Resources 109, pp. 267-289, 2017 (34 pages).

Karimi-Fard, M., et al., "Generation of coarse-scale continuum flow models from detailed fracture characterizations", Water Resources Research, vol. 42, W10423, 2006 (13 pages).

Fumagalli, Alessio, et al., "An upscaling procedure for fractured reservoirs with embedded grids", AGU Publications, Water Resources Research, pp. 6506-6525, Aug. 25, 2016 (20 pages).

Dykhuizen, R. C., "A New Coupling Term for Dual-Porosity Models", Water Resources Research, vol. 26, No. 2, pp. 351-356, Feb. 1990 (6 pages).

Santoso, Ryan, et al., "Application of Machine-Learning to Construct Simulation Models from High-Resolution Fractured Formation", Society of Petroleum Engineers, SPE-197439-MS, pp. 1-13, 2019 (13 pages).

Santoso, Ryan, et al., "Optimization of Energy Recovery from Geothermal Reservoirs Undergoing Re-Injection: Conceptual Application in Saudi Arabia", Society of Petroleum Engineers, SPE-195155-MS, pp. 1-17, 2019 (17 pages).

Gong, B., et al., "Upscaling Discrete Fracture Characterizations to Dual-Porosity, Dual-Permeability Models for Efficient Simulation of Flow With Strong Gravitational Effects", Society of Petroleum Engineers, pp. 58-57, 2018 (10 pages).

Sarma, Pallav, et al., "New Transfer Functions for Simulation of Naturally Fractured Reservoirs With Dual-Porosity Models", Society of Petroleum Engineers, pp. 328-340, 2006 (13 pages).

Di Donato, Ginevra, et al., "Streamline-Based Dual Porosity Simulation of Fractured Reservoirs", SPE 84036, Society of Petroleum Engineers, pp. 1-11, Oct. 8, 2003 (11 pages).

Penueia, G., et al., "Time-Dependent Shape Factors for Interporosity Flow in Naturally Fractured Gas-Condensate Reservoirs", SPE 75524, Society of Petroleum Engineers, pp. 1-18, Apr. 30-May 2, 2002 (18 pages).

Beckner, B.L., et al., "Simulating Naturally Fractured Reservoirs Using a Subdomain Method", SPE 21241, Society of Petroleum Engineers, pp. 1-14, 1991 (14 pages).

He, Xupeng, et al., "Application of Machine-Learning to Construct Equivalent Continuum Models from High-Reslution Discrete-Fracture Models", IPTC-20040-MS, International Petroleum Technology Conference, pp. 1-18, 2020 (18 pages).

Gilman, J.R., et al., "Improved Calculations for Viscous and Gravity Displacement in Matrix Blocks in Dual-Porosity Simulators", Journal of Petroleum Technology, Jan. 1988 (22 pages).

Wu, Yu-Shu, et al., "A Multiple-Porosity Method for Simulation of Naturally Fractured Petroleum Reservoirs", SPE Reservoir Engineering, pp. 327-336, Feb. 1988 (10 pages).

Gilman, J.R., "An Efficient Finite-Difference Method for Simulating Phase Segregation in the Matrix Blocks in Double-Porosity Reservoirs", SPE Reservoir Engineering, pp. 403-414, Jul. 1986 (11 pages).

Pruess, Karsten, et al., "A Practical Method for Modeling Fluid and Heat Flow in Fractured Porous Media", Society of Petroleum Engineers Journal, Mar. 9, 1984; pp. 14-26 (13 pages).

Warren, J. E., et al., "The Behavior of Naturally Fractured Reservoirs", Society of Petroleum Engineers, SPE-426-PA, pp. 245-255, Sep. 1963 (11 pages).

Andrianov, N., et al., "Learning the Matrix-Fractures Transfer Rate Using a Convolutional Neural Network", EAGE, First EAGE Digitalizaztion Conference and Exhibition, Nov. 30-Dec. 3, 2020 (5 pages).

Araya-Polo, M., et al., "Deep Learning-Driven Pore-Scale Simulation For Permeability Estimation", EAGE, ECMOR XVI, 16th European Conference on the Mathematics of Oil Recovery, 2018 (14 pages).

Karimi-Fard, M., et al., "An Efficient Discrete-Fracture Model Applicable for General-Purpose Reservoir Simulators", Society of Petroleum Engineers, pp. 227-236, 2004 (10 pages).

Kazemi, H., et al., "Numerical Simulation of Water-Oil Flow in Naturally Fractured Reservoirs", Society of Petroleum Engineers, SPE 5719, pp. 317-326, 1976 (10 pages).

Lee, S. H., et al., "Hierarchical modeling of flow in naturally fractured formations with multiple length scales", Water Resources Research, vol. 37, No. 3, pp. 443-455, Mar. 2001 (13 pages).

Li, Yuanjun, et al., "Deep Learning for Well Data History Analysis", Society of Petroleum Engineers, SPE-196011-MS, pp. 1-16, 2019 (16 pages).

Otsu, Nobuyuki, "A Threshold Selection Method from Gray-Level Histograms", IEEE Transactions On Systems, Man, and Cybernetics, vol. SMC-9, No. 1, pp. 62-66, Jan. 1979 (5 pages).

He, Xupeng, et al., "Fracture Permeability Estimation Under Complex Physics: A Data-Driven Model Using Machine Learning", SPE-206352-MS, SPE Annual Technical Conference and Exhibition, Dubai, UAE; Sep. 2021 (15 pages).

Office Action issued in corresponding Saudi Arabian Application No. 122440275, dated Jan. 10, 2024 (7 pages).

* cited by examiner

METHOD AND SYSTEM FOR DETERMINING COARSENED GRID MODELS USING MACHINE-LEARNING MODELS AND FRACTURE MODELS

BACKGROUND

Natural fractures present in subsurface formations are discontinuities representing a surface or zone of mechanical failure in the formation. In particular, fractures may be formed over geological time as a result of movements and deformations within the subsurface rock, and continue to form as a result of microseismic events. Fracture prediction is one of the more challenging problems in reservoir characterization. Fracture distributions are related to various factors such as intrinsic rock mechanic properties as well as movements and deformation of rock layers due to different tectonic stages.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a method that includes obtaining, by a computer processor, fracture image data regarding a geological region of interest. The method further includes determining, by the computer processor, various fractures in the fracture image data using a first artificial neural network and a pixel-searching process. The method further includes determining, by the computer processor, a fracture model using the fractures, a second artificial neural network, and borehole image data. The method further includes determining, by the computer processor, various fracture permeability values using the fracture model and a third artificial neural network. The method further includes determining, by the computer processor, various matrix permeability values for the geological region of interest using core sample data. The method further includes generating, by the computer processor, a coarsened grid model for the geological region of interest using a fourth artificial neural network, the matrix permeability values, and the fracture permeability values.

In general, in one aspect, embodiments relate to a method that includes obtaining, by a computer processor, fracture image data. The method further includes obtaining, by the computer processor, training transmissibility data regarding a fracture-fracture connection and a fracture-matrix connection. The method further includes generating, by the computer processor, an artificial neural network using various machine-learning epochs, the fracture image data, the training transmissibility data, and predicted transmissibility data. The artificial neural network is updated during the machine-learning epochs based on a comparison between a portion of the training transmissibility data and the predicted transmissibility data that is generated by the artificial neural network. The artificial neural network predicts data that describes various phase flows within the fracture-fracture connection and the fracture-matrix connection.

In general, in one aspect, embodiments relate to a method that includes a logging system coupled to various logging tools. A reservoir simulator includes a computer processor and is coupled to the logging system. The reservoir simulator obtains fracture image data regarding a geological region of interest. The reservoir simulator determines various fractures in the fracture image data using a first artificial neural network and a pixel-searching process. The reservoir simulator determines a fracture model using the fractures, a second artificial neural network, and borehole image data. The reservoir simulator determines various fracture permeability values using the fracture model and a third artificial neural network. The reservoir simulator determines various matrix permeability values for the geological region of interest using core sample data. The reservoir simulator generates a coarsened grid model for the geological region of interest using a fourth artificial neural network, the matrix permeability values, and the fracture permeability values.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for using multiple artificial neural networks to generate a coarsened grid model and/or a multiphase simulation model. Furthermore, a multiphase simulation model may be based on a coarsened grid model and include up scaled multiphase flow properties, such as permeability, transmissibility, and saturation (e.g., for estimating reserves and development plans of fractured oil, gas and geothermal reservoirs). As such, some embodiments use fracture network recognition to determine fractures and fracture connections within outcrop images and borehole image logs. Likewise, the workflow may determine fracture and matrix hydraulic properties, such as permeability values, in order to construct a multiphase simulation model with upscaled data.

In some embodiments, a multiphase simulation model is generated using a deep artificial neural network that predicts upscaled multiphase data. After obtaining training-validation data (e.g., fracture image data as an input, training transmissibility data for analyzing the model's output), a straight two-point flux approximation (TPFA) finite volume scheme may be applied to an embedded fracture model. A trial-error analysis may be performed iteratively in a training operation until the trained model satisfies a predetermined criterion (e.g. a predetermined level of prediction accuracy). Based on error data from the trial-error analysis, weights and biases within an artificial neural network may be adjusted to optimize the artificial neural network architecture and the related model parameters.

Figure 1:
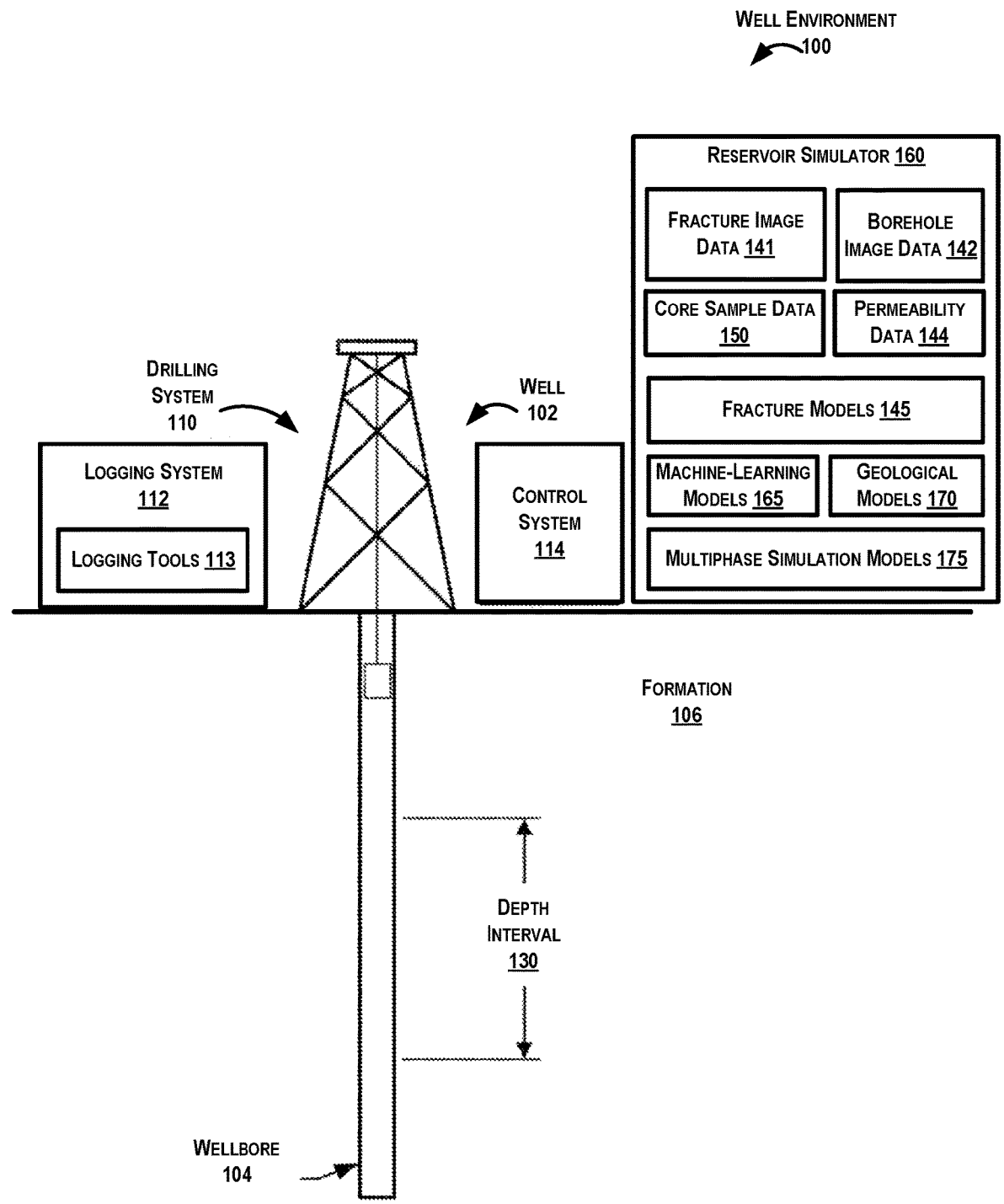
FIGS. 1, 2A, 2B, 3A, and 3B show systems in accordance with one or more embodiments.

Turning to FIG. 1, FIG. 1 shows a schematic diagram in accordance with one or more embodiments. As shown, FIG. 1 illustrates a well environment (100) that may include a well (102) having a wellbore (104) extending into a formation (106). The wellbore (104) may include a bored hole that extends from the surface into a target zone of the formation (106), such as a reservoir. The formation (106) may include various formation characteristics of interest, such as formation porosity, formation permeability, resistivity, density, water saturation, and the like. Porosity may indicate how much space exists in a particular rock within an area of interest in the formation (106), where oil, gas, and/or water may be trapped. Permeability may indicate the ability of liquids and gases to flow through the rock within the area of interest. Resistivity may indicate how strongly rock and/or fluid within the formation (106) opposes the flow of electrical current. For example, resistivity may be indicative of the porosity of the formation (106) and the presence of hydrocarbons. More specifically, resistivity may be relatively low for a formation that has high porosity and a large amount of water, and resistivity may be relatively high for a formation that has low porosity or includes a large amount of hydrocarbons. Water saturation may indicate the fraction of water in a given pore space.

Keeping with FIG. 1, the well environment (100) may include a reservoir simulator (160) and various well systems, such as a drilling system (110), a logging system (112), a control system (114), and a well completion system (not shown). The drilling system (110) may include a drill string, drill bit, a mud circulation system and/or the like for use in boring the wellbore (104) into the formation (106). The control system (114) may include hardware and/or software for managing drilling operations and/or maintenance operations. For example, the control system (114) may include one or more programmable logic controllers (PLCs) that include hardware and/or software with functionality to control one or more processes performed by the drilling system (110). Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a data acquisition and monitoring system that is used to acquire equipment data and to monitor one or more well operations, or a well interpretation software system that is used to analyze and understand well events, such as drilling progress. A logging system may be similar to a control system with a specific focus on managing one or more logging tools.

Turning to the reservoir simulator (160), a reservoir simulator (160) may include hardware and/or software with functionality for storing and analyzing well logs, such as borehole image data (142), core sample data (150), fracture image data (141), seismic data, reservoir property data, such as porosity data and permeability data (144), and/or other types of data to generate and/or update one or more fracture models (145), one or more geological models (170), and/or one or more multiphase simulation model. Borehole image data (142) may be based on electrical and/or acoustic logging techniques, for example. Fracture image data (141) may include outcrop images and other image types that include one or more fractures. Geological models may include geochemical or geomechanical models that describe structural relationships within a particular geological region. A multiphase simulation model may be a type of geological model that describes dynamic interactions between different phases, such as oil, water, or gas. For example, a multiphase simulation model may describe changes in fracture-fracture transmissibility values and fracture-matrix transmissibility values within a geological region.

While the reservoir simulator (160) is shown at a well site, in some embodiments, the reservoir simulator (160) may be remote from a well site. In some embodiments, the reservoir simulator (160) is implemented as part of a software platform for the control system (114). The software platform may obtain data acquired by the drilling system (110) and logging system (112) as inputs, which may include multiple data types from multiple sources. The software platform may aggregate the data from these systems (110, 112) in real time for rapid analysis. In some embodiments, the control system (114), the logging system (112), the reservoir simulator (160), and/or a user device coupled to one of these systems may include a computer system that is similar to the computer system (1202) described below with regard to FIG. 9 and the accompanying description.

The logging system (112) may include one or more logging tools (113) for use in generating well logs of the formation (106). For example, a logging tool may be lowered into the wellbore (104) to acquire measurements as the tool traverses a depth interval (130) (e.g., a targeted reservoir section) of the wellbore (104). The plot of the logging measurements versus depth may be referred to as a "log" or "well log". Well logs (140) may provide depth measurements of the well (104) that describe such reservoir characteristics as formation porosity, formation permeability, resistivity, water saturation, and the like. The resulting logging measurements may be stored and/or processed, for example, by the control system (114), to generate corresponding well logs for the well (102). A well log may include, for example, a plot of a logging response time versus true vertical depth (TVD) across the depth interval (130) of the wellbore (104).

Turning to examples of logging techniques, multiple types of logging techniques are available for determining various reservoir characteristics. In some embodiments, gamma ray logging is used to measure naturally occurring gamma radiation to characterize rock or sediment regions within a wellbore. In particular, different types of rock may emit different amounts and different spectra of natural gamma radiation. For example, gamma ray logs may distinguish between shales and sandstones/carbonate rocks because radioactive potassium may be common to shales. Likewise, the cation exchange capacity of clay within shales may also result in higher absorption of uranium and thorium further increasing the amount of gamma radiation produced by shales.

Turning to nuclear magnetic resonance (NMR) logging, an NMR logging tool may measure the induced magnetic moment of hydrogen nuclei (i.e., protons) contained within the fluid-filled pore space of porous media (e.g., reservoir rocks). Thus, NMR logs may measure the magnetic response of fluids present in the pore spaces of the reservoir rocks. In so doing, NMR logs may measure both porosity and permeability, as well as the types of fluids present in the pore spaces. Thus, NMR logging may be a subcategory of electromagnetic logging that responds to the presence of hydrogen protons rather than a rock matrix. Because hydrogen protons may occur primarily in pore fluids, NMR logging may directly or indirectly measure the volume, composition, viscosity, and distribution of pore fluids.

Turning to spontaneous potential (SP) logging, SP logging may determine the permeabilities of rocks in the formation (106) by measuring the amount of electrical current generated between drilling fluid produced by the drilling system (110) and formation water that is held in pore spaces of the reservoir rock. Porous sandstones with high permeabilities may generate more electricity than impermeable shales. Thus, SP logs may be used to identify sandstones from shales.

Another type of electrical logging technique is resistivity logging. Resistivity logging may measure the electrical resistivity of rock or sediment in and around the wellbore (104). In particular, resistivity measurements may determine what types of fluids are present in the formation (106) by measuring how effective these rocks are at conducting electricity. Because fresh water and oil are poor conductors of electricity, they have high resistivities. As such, resistivity measurements obtained via such logging can be used to determine corresponding reservoir water saturation ($S_w$).

Another electrical logging technique is dielectric logging. For example, dielectric permittivity may be defined as a physical quantity that describes the propagation of an electromagnetic field through a dielectric medium. As such, dielectric permittivity may describe a physical medium's ability to polarize in response to an electromagnetic field, and thus reduce the total electric field inside the physical medium. In a portion of reservoir rock, water may have a large dielectric permittivity that is higher than any associated rock or hydrocarbon fluids within the portion. In particular, water permittivity may depend on a frequency of an electromagnetic wave, water pressure, water temperature, and salinity of the reservoir rock mixture. Likewise, a multi-frequency dielectric logging tool may determine a value of the water-filled porosity in the reservoir rock.

Keeping with dielectric logging, a dielectric logging tool may determine a dielectric constant (i.e., relative-permittivity) measurement. For example, the dielectric logging tool may include an antenna that detects relative dielectric constants between different fluids at a fluid interface. As such, a dielectric logging tool may generate a dielectric log of the high-frequency dielectric properties of a formation. In particular, a dielectric log may include two curves, where one curve may describe the relative dielectric permittivity of the analyzed rock and the other curve may describe the resistivity of the analyzed rock. Relative dielectric permittivity may be used to distinguish hydrocarbons from water of differing salinities. However, the effect of salinity may be more important than the salinity effect with a high-frequency dielectric log (also called an "electromagnetic propagation log").

Turning to caliper logging, the one or more logging tools (113) may include a caliper logging tool. For example, a caliper logging tool may include hardware to determine a diameter of a borehole along its depth. In particular, a caliper logging tool may measure variation in borehole diameters as the logging tool is withdrawn from the bottom of a borehole, using two or more articulated arms that push against the borehole wall. Moreover, some caliper logging tools may use electromagnetic techniques or acoustic techniques to determine diameter sizes. For electromagnetic sensing techniques, a caliper logging tool may include a coil centered inside a tubular that generates an alternating magnetic field and another coil farther up the logging tool that measures phase shift introduced by the tubular. For acoustic sensing techniques, a caliper logging tool may include a transducer that detects a high-frequency pulse reflected from a tubular or a borehole wall back to the transducer. As such, a diameter measurement may be determined from the time of flight of this reflected wave and a fluid's acoustic velocity. In some embodiments, a caliper logging tool is a multifinger caliper.

Turning to sonic logging or acoustic logging, the logging system (112) may measure the speed that acoustic waves travel through rocks in the formation (106) to determine porosity in the formation (106). This type of logging may generate borehole compensated (BHC) logs, which are also called sonic logs. In general, sound waves may travel faster through high-density shales than through lower-density sandstones. Other types of logging include density logging and neutron logging. Density logging may determine porosity measurements by directly measuring the density of the rocks in the formation (106). Furthermore, neutron logging may determine porosity measurements by assuming that the reservoir pore spaces within the formation (106) are filled with either water or oil and then measuring the amount of hydrogen atoms (i.e., neutrons) in the pores. Other types of logging are also contemplated, such as resistivity logging and dielectric logging.

Turning to coring, reservoir characteristics may be determined using core sample data (e.g., core sample data (150)) acquired from a well site. For example, certain reservoir characteristics can be determined via coring (e.g., physical extraction of rock specimens) to produce core specimens and/or logging operations (e.g., wireline logging, logging-while-drilling (LWD) and measurement-while-drilling (MWD)). Coring operations may include physically extracting a rock specimen from a region of interest within the wellbore (104) for detailed laboratory analysis. For example, when drilling an oil or gas well, a coring bit may cut core plugs (or "cores" or "core specimens") from the formation (106) and bring the core plugs to the surface, and these core specimens may be analyzed at the surface (e.g., in a lab) to determine various characteristics of the formation (106) at the location where the specimen was obtained.

Turning to various coring technique examples, conventional coring may include collecting a cylindrical specimen of rock from the wellbore (104) using a core bit, a core barrel, and a core catcher. The core bit may have a hole in its center that allows the core bit to drill around a central cylinder of rock. Subsequently, the resulting core specimen may be acquired by the core bit and disposed inside the core barrel. More specifically, the core barrel may include a special storage chamber within a coring tool for holding the core specimen. Furthermore, the core catcher may provide a grip to the bottom of a core and, as tension is applied to the drill string, the rock under the core breaks away from the undrilled formation below coring tool. Thus, the core catcher may retain the core specimen to avoid the core specimen falling through the bottom of the drill string.

In some embodiments, a micro computed tomography (micro-CT) scan is performed on a core sample. For example, a micro-CT scanner may generate a series of 2D planar X-ray images. These image may correspond to different slices of a core sample that may be further processed into a three-dimensional (3D) model that can reveal its internal rock features. In some embodiments, for example, a micro-CT scan may provide a non-destructive technique for 3D imaging of the pore space at a resolution of several microns. Several types of micro-CT scanning may be used, such as a desktop micro-CT scanner that uses an X-ray generation tube, and a synchrotron X-ray micro-tomography. In particular, a micro-CT scanner may use various X-rays to penetrate from different view points in a core sample to produce an attenuated projection profile that is used for later reconstruction using a filtered back projection algorithm.

Keeping with FIG. 1, geosteering may be used to position the drill bit or drill string of the drilling system (110) relative to a boundary between different subsurface layers (e.g., overlying, underlying, and lateral layers of a pay zone) during drilling operations. In particular, geological model may be used by the drilling system (110) for steering the drill bit in the direction of desired hydrocarbon concentrations. In some embodiments, a well path of a wellbore (104) may be updated by the control system (114) using a geological model. For example, a control system (114) may communicate geosteering commands to the drilling system (110) based on well log data updates that are further adjusted by the reservoir simulator (160) using a geological model. As such, the control system (114) may generate one or more control signals for drilling equipment (or a logging system may generate for logging equipment) based on an updated well path design and/or an updated geological model. As such, a geosteering system may use various sensors located inside or adjacent to the drill string to determine different rock formations within a well path. In some geosteering systems, drilling tools may use resistivity or acoustic measurements to guide the drill bit during horizontal or lateral drilling.

Returning to a reservoir simulator (160), a reservoir simulator (160) may include hardware and/or software with functionality for generating one or more machine-learning models (165) for use in analyzing the formation (106). For example, the reservoir simulator (160) may store well logs and core sample data (150), and further analyze the well log data, the core sample data, seismic data, and/or other types of data to generate and/or update one or more machine-learning models (165) and/or one or more geological models (170). Thus, different types of machine-learning models may be trained, such as convolutional neural networks, U-Net models, deep neural networks, recurrent neural networks, support vector machines, decision trees, inductive learning models, deductive learning models, supervised learning models, unsupervised learning models, reinforcement learning models, etc. In some embodiments, two or more different types of machine-learning models are integrated into a single machine-learning architecture, e.g., a machine-learning model may include decision trees and neural networks. In some embodiments, the reservoir simulator (160) may generate augmented or synthetic data to produce a large amount of interpreted data for training a particular model.

With respect to neural networks, for example, a neural network may include one or more hidden layers, where a hidden layer includes one or more neurons. A neuron may be a modelling node or object that is loosely patterned on a neuron of the human brain. In particular, a neuron may combine data inputs with a set of coefficients, i.e., a set of network weights for adjusting the data inputs. These network weights may amplify or reduce the value of a particular data input, thereby assigning an amount of significance to various data inputs for a task being modeled. Through machine learning, a neural network may determine which data inputs should receive greater priority in determining one or more specified outputs of the neural network. Likewise, these weighted data inputs may be summed such that this sum is communicated through a neuron's activation function to other hidden layers within the neural network. As such, the activation function may determine whether and to what extent an output of a neuron progresses to other neurons where the output may be weighted again for use as an input to the next hidden layer.

Turning to convolutional neural networks, a convolutional neural network (CNN) is a type of artificial neural network that may be used in computer vision and image recognition, e.g., for processing pixel data. For example, a convolutional neural network may include functionality for performing an application of a filter to an input (e.g., an input image) that results in a particular activation, where repeated filter application may result in an output map of activations called a feature map. A feature map may indicate the locations and strength of one or more detected features in the input to the convolutional neural network. Thus, a convolutional neural network may have the ability to automatically learn multiple filters in parallel specific to a training dataset under the constraints of a specific predictive modeling problem, such as image classification.

Turning to U-Net models, a U-Net model may have a deep neural network architecture that includes functionality for classifying and/or segmenting images. For example, a U-Net architecture may include various hidden layers that operate as an encoder network followed by various layers that operate as a decoder network. In particular, a U-Net model may perform semantic segmentation that includes pixel discrimination along with a mechanism to determine features at different encoder stages onto a pixel space. For example, a U-Net model may include various convolution layers followed by maxpool and downsampling layers to encode an input image into feature representations. Likewise, the U-Net model may also include up sampling and concatenation layers followed by regular convolution layers for performing the decoding operations.

In some embodiments, a reservoir simulator (160) uses one or more ensemble learning methods in connection to the machine-learning models (165). For example, an ensemble learning method may use multiple types of machine-learning models to obtain better predictive performance than available with a single machine-learning model. In some embodiments, for example, an ensemble architecture may combine multiple base models to produce a single machine-learning model. One example of an ensemble learning method is a BAGGing model (i.e., BAGGing refers to a model that performs Bootstrapping and Aggregation operations) that combines predictions from multiple neural networks to add a bias that reduces variance of a single trained neural network model. Another ensemble learning method includes a stacking method, which may involve fitting many different model types on the same data and using another machine-learning model to combine various predictions.

Figure 2A:
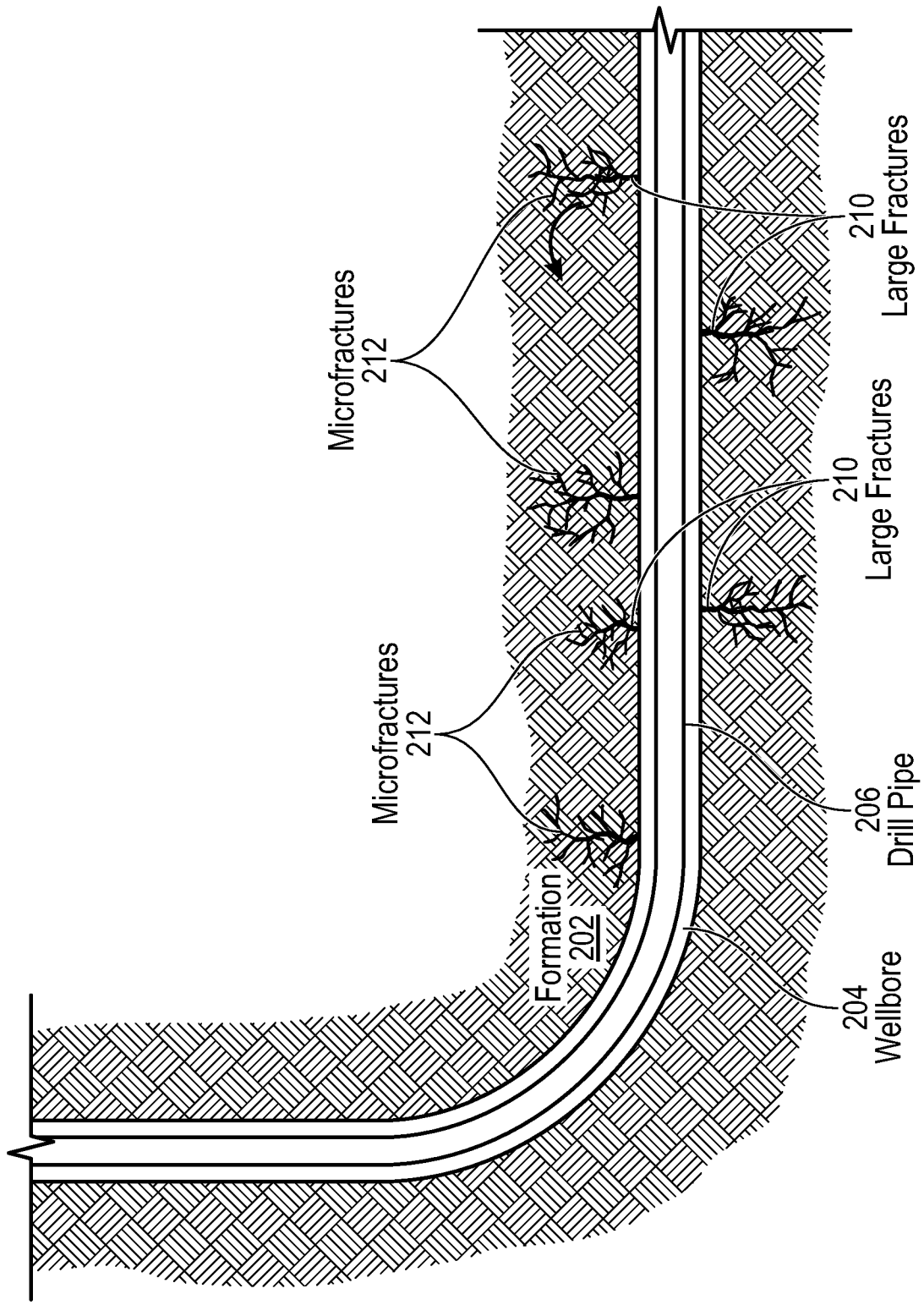

Turning to FIG. 2A, FIG. 2A shows a schematic diagram in accordance with one or more embodiments. As shown in FIG. 2A, FIG. 2A illustrates a hydraulic stimulation operation that forms additional microfractures (212) within a formation (202). More specifically, a wellbore (204) may be located within formation (202), where a casing string (206) is positioned within the wellbore (204). Following a hydraulic fracturing process, for example, large fractures (210) may exist within the formation (202) and extend outward from the wellbore (204). In particular, hydrocarbon reserves may be trapped within certain low permeability formations, such as sand, carbonate, and/or shale formations. Thus, stimulation treatments may be performed by a well completion assembly or well completion system that enhances well productivity at one or more wells, where one type of stimulation treatment is hydraulic fracturing. In some embodiments, for example, hydraulic fracturing includes injecting high viscosity fluids into a wellbore at a sufficiently high injection rate so that enough pressure is produced within the wellbore to split the formation. As such, a stimulation operation may be determined that achieves a desired height and/or length of one or more induced fractures.

Keeping with FIG. 2A, various stimulation procedures may be employed that use one or more techniques to ensure that an induced fracture becomes conductive after injection ceases. For example, during acid fracturing of carbonate formations, acid-based fluids may be injected into the formation to create an etched fracture and conductive channels. These conductive channels may be left open upon closure of the induced fracture. With sand or shale formations, a proppant may be included with the hydraulic fracturing fluid such that the induced fracture remains open during or following a stimulation treatment. Likewise, in carbonate formations, a stimulation treatment may include both acid fracturing fluids and proppants. Accordingly, heat produced within a formation, acid, or aqueous water transmitted into the formation may all play a role in producing reactions causing one or more microfractures in a formation.

Keeping with hydraulic fracturing, a hydraulic fracturing operation may include well completion assembly with one or more inflatable packers as well as a work string or casing string (206) that extends within a wellbore. A casing string may include steel casing or pipe that may be divided into surface casing, intermediate casing, and/or production casing. Packers may include inflatable packers that seal an annulus defined between well completion equipment and an inner wall of the wellbore in order to divide a formation into multiple wellbore intervals. These wellbore intervals may be separately or simultaneously stimulated during a hydraulic stimulation operation. Thus, in a hydraulic fracturing operation, a hydraulic fracturing fluid may be pumped through the casing string (206) and into a targeted formation using various perforations (i.e., open holes) in the casing string (206).

By injecting the hydraulic fracturing fluid at pressures high enough to cause the rock within the targeted formation to fracture, the hydraulic fracturing operation may "break down" the formation. As high-pressure fluid injection continues, a fracture may continue to propagate into a fracture network. This high pressure for injecting the hydraulic fracturing fluid may be referred to as the "propagation pressure" or "extension pressure." As an induced fracture continues to grow, a proppant, such as sand, may be added to the fracturing fluid. Once a desired fracture network is formed, the fluid flow may be reversed and the liquid portion of the fracturing fluid is removed. The proppant is intentionally left behind to prevent the fractures from closing onto themselves due to the weight and stresses within the formation. Accordingly, the proppant may "prop" or support the induced fractures to remain open, by remaining sufficiently permeable for hydrocarbon fluids to flow through the induced fracture. Thus, a proppant may form a packed bed of particles with interstitial void space connectivity within a formation. Accordingly, a higher permeability fracture may result from the hydraulic fracturing operation.

In some embodiments, for example, a hydraulic fracturing fluid with an activator is injected into the formation (202), where the fluid migrates within the large fractures (210). Upon a reaction caused by the activator, the injection fluid may produce one or more gases and heat, thereby causing the microfractures (212) to be created within the formation (202). Thus, a stimulation treatment may provide pathways for the hydrocarbon deposits trapped within the formation (202) to migrate and be recovered by a production well.

Furthermore, fracture monitoring may be important to understanding and optimizing hydraulic fracturing treatments. For example, a hydraulic stimulation manager may perform diagnostics that determine various stimulation effects such as fracture geometry, proppant placement in one or more fractures, and/or fracture conductivity. This fracture monitoring may be performed using a distributed acoustic sensing (DAS) system implemented within a wellbore. In some embodiments, a DAS system includes various fiber-optic sensors (e.g., distributed over a single mode optical fiber several kilometers in length). As such, backscattered light may be measured and further analyzed using signal processing techniques to enable a DAS system to segregate an optical fiber into an array of individual acoustic receivers. More specifically, various pulses of light may be transmitted along the optical fiber, where characteristics of the backscattered light may change due to acoustic vibrations disturbing the casing of the optical fiber. Through DAS processing, the location of these disturbances may be identified.

Keeping with DAS systems, pumping operations may produce various acoustic signals along a wellbore and the adjacent fractures, where the acoustic sensing data depends upon geometrical and physical attributes of the propagating fractures. Accordingly, a quantitative DAS inversion may determine various fracture properties in hydraulic fracture monitoring. For example, a wellbore may be profiled in real time by removing DAS pump noise data and matching acquired data to a forward model regarding pulse propagation in the wellbore and adjacent fractures. Thus, DAS inversion may identify various hydraulic stimulation features such as tubing expansion, fluid-to-fluid interfaces, an adjacent hydraulic fracture, presence of a porous reservoir, and/or an annular compartment. During initial phases of a hydraulic stimulation operation, DAS inversion may determine location information of wireline logging equipment within a wellbore. For example, DAS techniques may verify whether perforating guns and packer-setting devices are disposed at desired depths in the wellbore. In some embodiments, DAS inversion is performed using additional data from distributed temperature sensors (DTS) and/or microseismic monitoring techniques.

In certain unconventional formations, for example, an important element that determines whether it is economically viable to develop a reservoir is the presence of one or more sweet spots in the reservoir. A sweet spot may be generally defined herein as the area within a reservoir that represents the best production or potential for production. In a particular geological region, the sweet spot may be determined based on a lack of ductility, a destruction of internal cohesion, an ability for a rock to deform and fail with a low degree of inelastic behavior, and a rock's capability for self-sustaining fracturing. In other words, hydraulic stimulation operations may be applied to formations that easily fracture to produce more microfractures with little plastic deformation under compression.

With respect to proppant systems, a well completion system may include a proppant system. A proppant system may include transfer devices, such as chutes and conveyor belts, for transferring a propping agent (also called simply "proppant") to a fluid mixing system. Likewise, a proppant system may include one or more proppant storage devices (e.g., proppant storage device A (193)), such as a silo, and a housing. In particular, a silo may use fill ports for acquiring propping agents, which may be subsequently transferred to a fluid mixing system using drain valves and/or outlet ports. The proppant system may then dispense the propping agent to the fluid mixing system for producing a stimulation fluid.

Moreover, a stimulation treatment for a formation may be updated by a reservoir simulator using a geological model (e.g., one of the geological models (170)) or a multiphase simulation model (e.g., one of the multiphase simulation models (175)). For example, a reservoir simulator may use a geological model or a multiphase simulation model to perform one or more stimulation simulations using different injection fluid pressure rates, different types of proppants, acid-based treatments and non-acid treatments, etc., to determine a desired stimulation scenario for the formation.

Figure 2B:
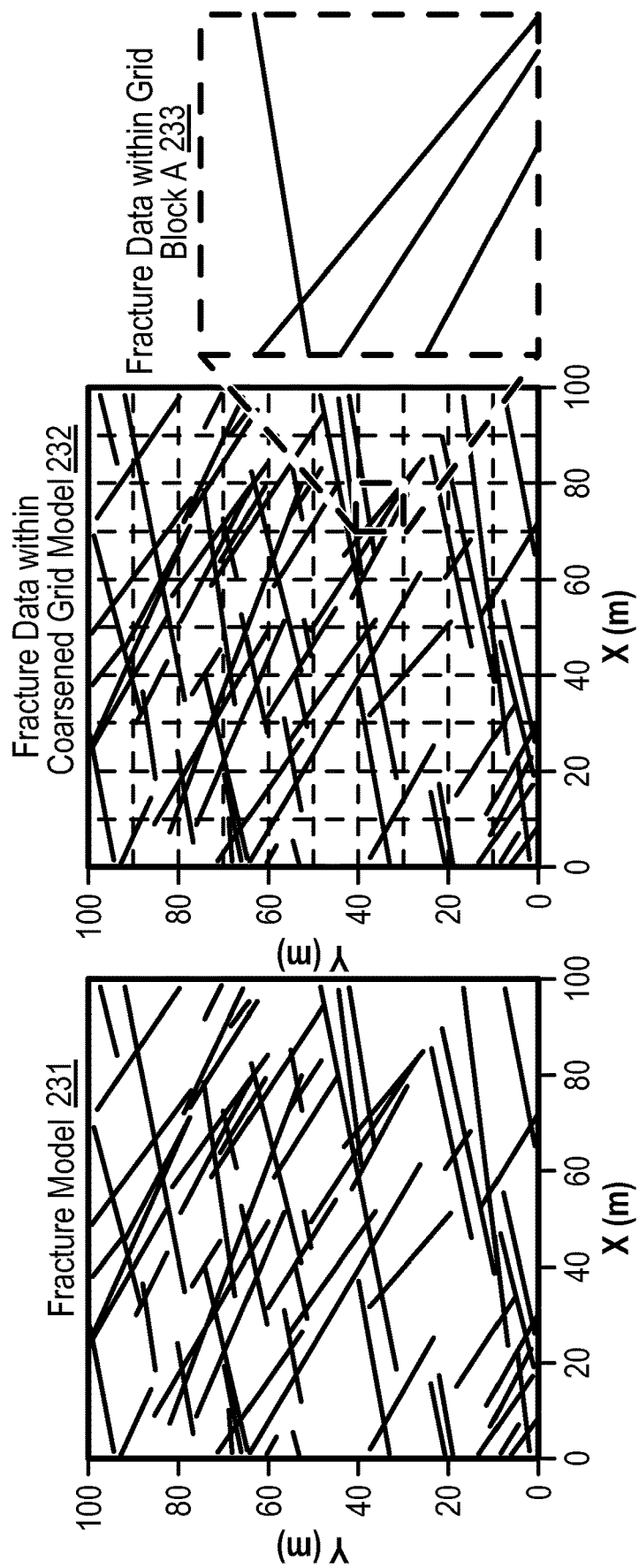

Turning to FIG. 2B, FIG. 2B shows a schematic diagram in accordance with one or more embodiments. In FIG. 2B, a fracture model (231) is illustrated for a particular geological region. In particular, the fracture model (231) shows a fracture distribution within two dimensions (i.e., along an x-axis and a y-axis). Thus, the fracture model (231) may provide a model for a fractured reservoirs through explicit representation of fractures and matrices using unstructured grids. For example, the fracture model (231) may be a discrete-fracture model (DFM). However, due to a contrast between fracture values and matrix properties, a simulation using a fracture model may be computationally expensive. Thus, the fracture model (231) may be converted into fracture data (232) within a coarsened grid model using an upscaling scheme to capture various fracture features in the original fracture model. For example, fracture data from the fracture model (231) is illustrated in a grid block A (233).

Figure 3A:
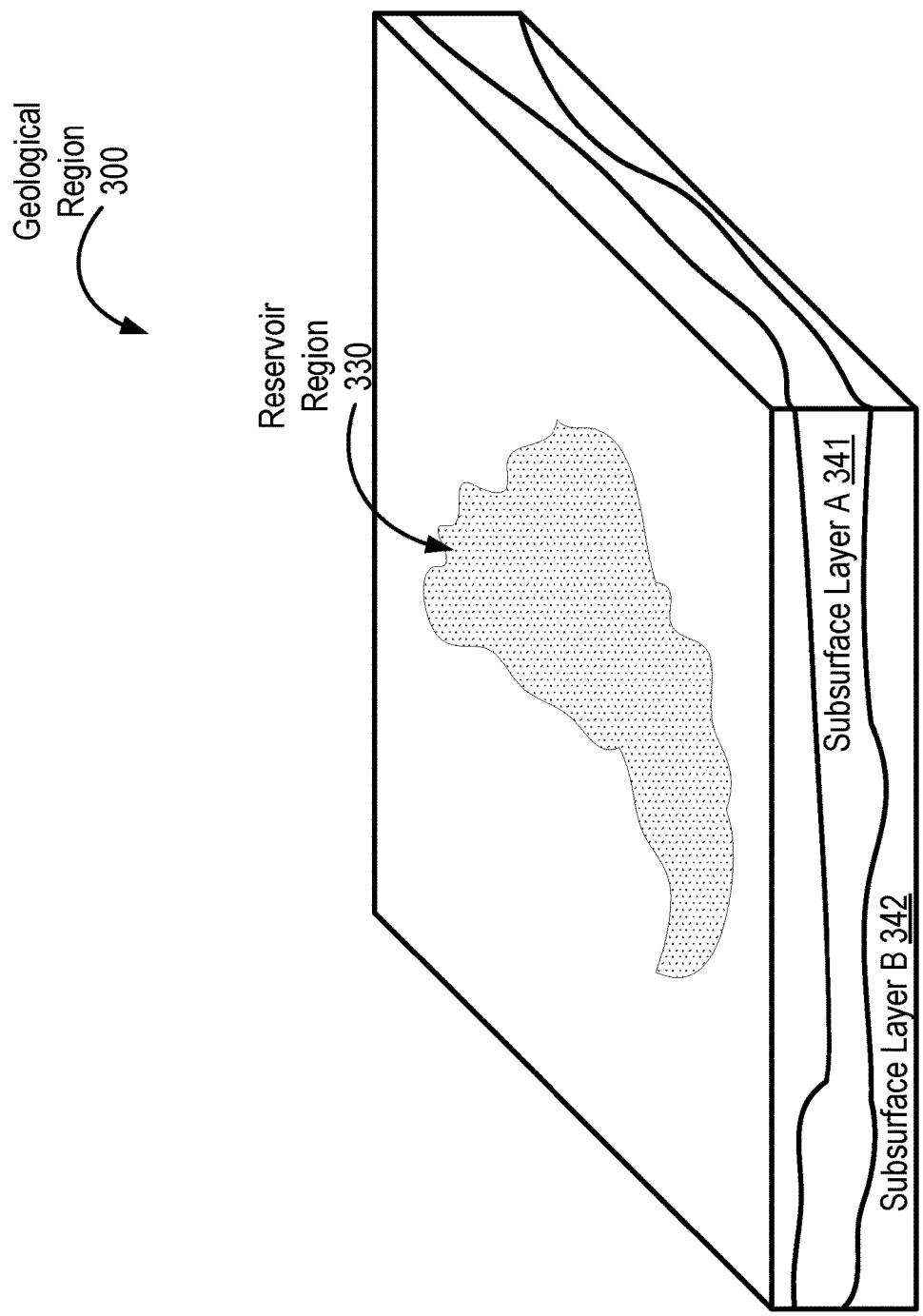
Figure 3B:
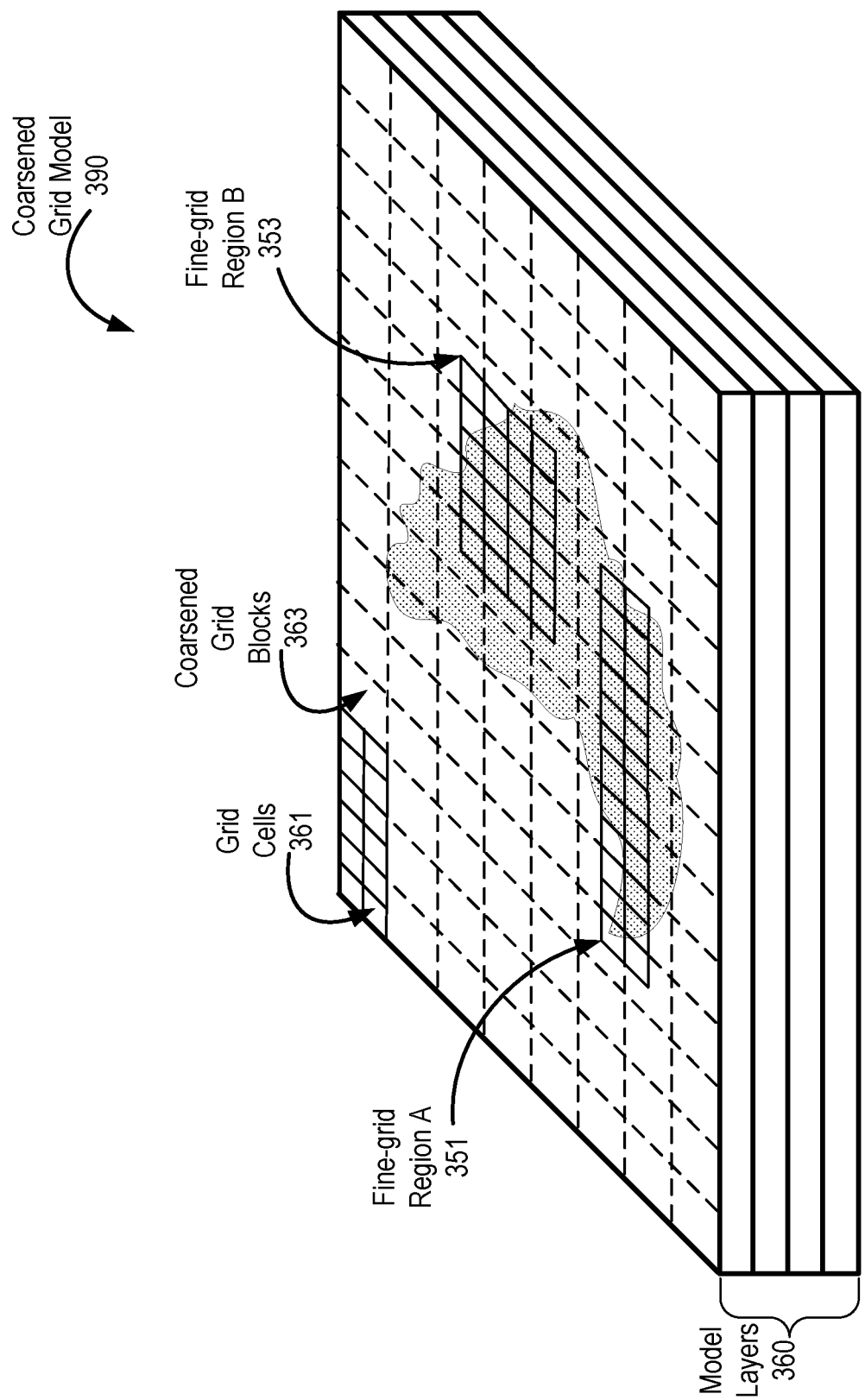

Turning to FIGS. 3A and 3B, FIGS. 3A and 3B show schematic diagrams in accordance with one or more embodiments. As illustrated in FIG. 3A, FIG. 3A shows a geological region (300) that may include one or more reservoir regions (e.g., reservoir region (330)) with subsurface layers (e.g., layer A (341) and subsurface layer B (342)) that may include one or more fractures (not shown). As illustrated in FIG. 3B, FIG. 3B shows a coarsened grid model (390) that corresponds to the geological region (300) from FIG. 3A. More specifically, the coarsened grid model (390) includes grid cells (361) that may refer to an original cell of a grid model as well as coarsened grid blocks (362) that may refer to an amalgamation of original cells of the grid model. For example, a grid cell may be the case of a 1×1 block, where coarsened grid blocks may be of sizes 2×2, 4×4, 8×8, etc. Both the grid cells (361) and the coarsened grid blocks (362) may correspond to columns for multiple model layers (360) within the coarsened grid model (390).

In some embodiments, a grid model may include static reservoir properties and dynamic reservoir properties. For example, static reservoir properties may include properties such as grid cell thickness (H), porosity (Phi), permeability (K), water saturation (Sw), and net-to-gross (NTG) values (i.e., a net-to-gross value may be the fraction of reservoir volume occupied by hydrocarbon-producing rocks). On the other hand, dynamic reservoir properties may include residual saturation values that describe various reservoir properties with respective to various well operations (such as a production operation or a reservoir stimulation operation). For example, residual oil saturation (Sor) may describe a fraction of a pore volume occupied by oil after an oil displacement process (e.g., production or stimulation operation). Thus, residual oil saturation may indicate a final oil recovery from a reservoir region using a specific oil displacement process. Likewise, residual oil saturation may be defined according to a predetermined displacement method (e.g., based on a type of displacement method, volume of the affected reservoir region, one or more fluid directions, and displacement fluid velocity). Residual oil saturation may be expressed as a ratio of immobile residual oil volume divided by an effective porosity for the reservoir region. Besides residual oil saturation, other types of residual saturation values include residual water saturation (Swr), critical water saturation (Swc), critical oil saturation (Soc), and residual gas saturation (Sgr). Moreover, some residual saturation values are used in the context of various well enhancement procedures, such as residual oil saturation after waterflooding (Sorw) and residual oil saturation after gas flooding (Sorg).

Dynamic reservoir data may also include various relative permeability values. A relative permeability value may be a dimensionless term devised to adapt a Darcy equation to various multiphase flow conditions. Additionally, relative permeability data may correspond to a ratio of an effective permeability of a particular fluid at a particular saturation to an absolute permeability of that fluid at a total saturation. For example, a relative permeability may be 1.0 where only a single fluid is present in rock within a particular geological region. As such, a relative permeability may be based on a comparison of the abilities of different fluids to flow in the presence of each other within the geological region. Examples of relative permeabilities include relative gas permeability (Krg), relative water permeability (Krw), end-point relative oil permeability (Krog), and end-point relative water permeability Krow). For illustration, relative gas permeability may correspond to a fraction of gas in the presence of liquids (i.e., oil and water), while relative oil permeability may correspond a permeability of oil in the presence of gas and irreducible water.

Prior to performing a reservoir simulation, local grid refinement and coarsening (LGR) may be used to increase or decrease grid resolutions in various regions of a grid model. For example, various reservoir properties, e.g., permeability, porosity, or saturations, may correspond to discrete values that are associated with a particular grid cell or coarsened grid block. However, by using discrete values to represent a portion of a geological region, a discretization error may occur in a reservoir simulation. Thus, various fine-grid regions may reduce discretization errors as the numerical approximation of a finer grid is closer to the exact solution, however through a higher computational cost. As shown in FIG. 3B, for example, the coarsened grid model (390) may include various fine-grid regions (i.e., fine-grid region A (351), fine-grid region B (352)), that are surrounded by coarsened block regions. Likewise, the original grid model without any coarsening may be referred to as a fine-grid model.

While FIGS. 1, 2A, 2B, 3A, and 3B shows various configurations of components, other configurations may be used without departing from the scope of the disclosure. For example, various components in FIGS. 1, 2A, 2B, 3A, and 3B may be combined to create a single component. As another example, the functionality performed by a single component may be performed by two or more components.

Figure 4:
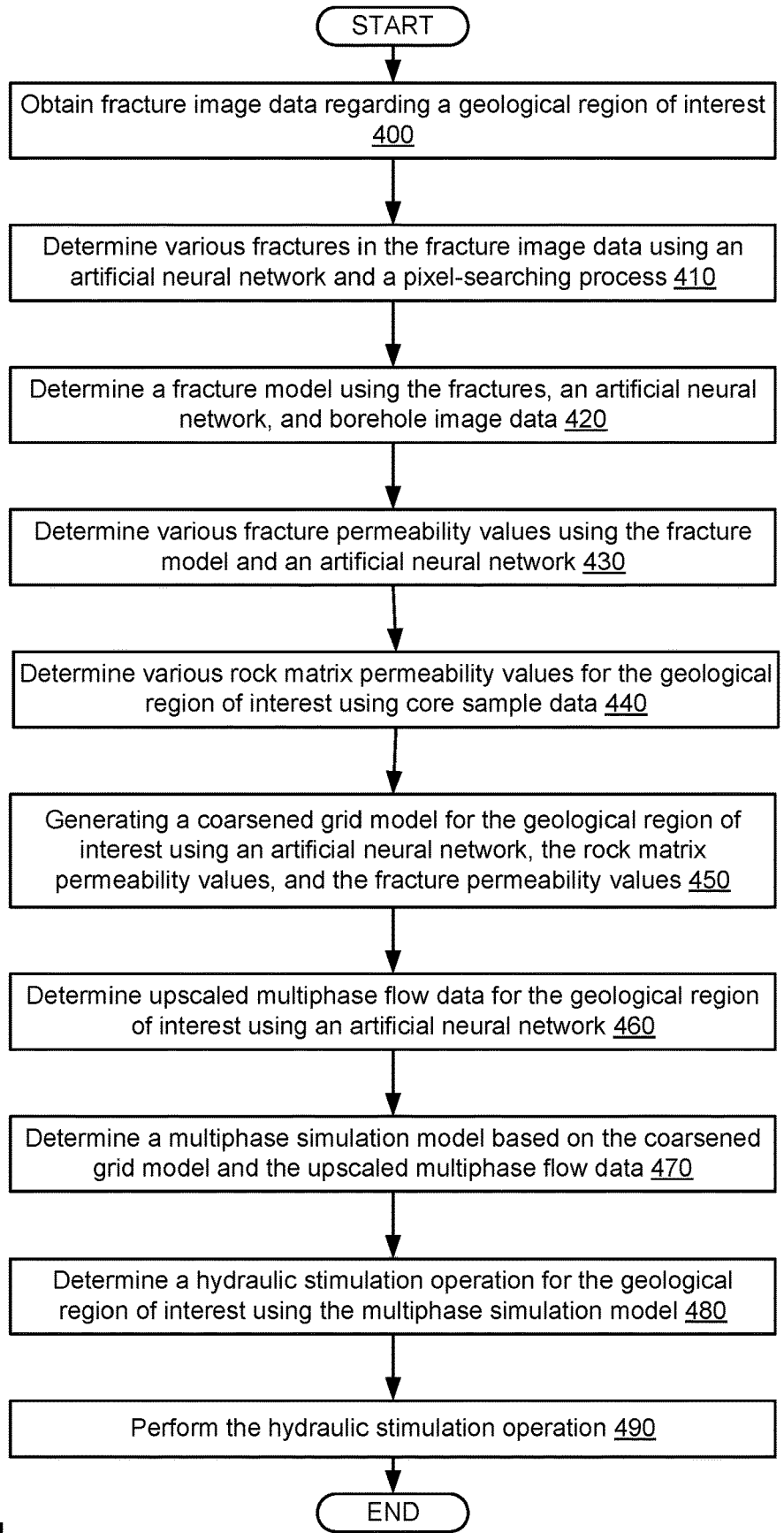
FIG. 4 shows a flowchart in accordance with one or more embodiments.

Turning to FIG. 4, FIG. 4 shows a flowchart in accordance with one or more embodiments. Specifically, FIG. 4 describes a general method for determining a coarsened grid model using various artificial neural networks. One or more blocks in FIG. 4 may be performed by one or more components (e.g., reservoir simulator (160)) as described in FIGS. 1, 2A, 2B, 3A, and 3B. While the various blocks in FIG. 4 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 400, fracture image data are obtained regarding a geological region of interest in accordance with one or more embodiments. A geological region of interest may be a portion of a geological area or volume that includes one or more formations of interest desired or selected for analysis, e.g., for determining a location of hydrocarbons or a place for a stimulation treatment. For example, a geological region of interest may be a specific formation being analyzed for one or more new wells.

In some embodiments, fracture image data is acquired using outcrop imaging. Outcrop imaging may be a separate process from well logging that is performed early in field development and prior to any drilling. In particular, outcrop images may be obtained to understand various layers in the reservoir, e.g., in regard to diagenesis or various rock properties. For example, outcrop images may be based on scanline surveys that use 1D approaches or 3D approaches based on laser scanning methods. A scanline survey of an outcrop may be a circular scanline or use a window-based approach. For illustration, various fractures intersecting a circular line may be imaged in a circular scanline survey. Other examples of outcrop images may include georeferenced aerial photos and other images that characterize topographic lineaments of a geological region. In some embodiments, outcrop images may be acquired using high-resolution photography, satellite imaging, or using cameras attached to drones. For example, unmanned aerial vehicles (UAVs) may generate high resolution images of an outcrop with 3D information using various techniques, such as motion photogrammetry.

In Block 410, various fractures are determined in fracture image data using an artificial neural network and a pixel-searching process in accordance with one or more embodiments. In some embodiments, for example, a reservoir simulator performs a fracture network recognition on the fracture image data. For example, an automated process may be used to delineate a fracture network from images, that can be used in building a discrete fracture network (DFN), e.g., for producing a fracture model in Block 420 below. The fracture image data may be based on various methods that have different measurement scales.

Using an artificial neural network, the neural network may perform a binary classification between fracture-occupied pixels and matrix-occupied pixels. For example, the artificial neural network may label pixels in the fracture image data with a '1' while matrix-occupied pixels are labeled with a '0'. In some embodiments, the artificial neural network is a U-Net model. For example, a U-Net model may segment various fractures within fracture images from continuous rock matrix regions. After identifying fracture-occupied pixels, a pixel-searching process may analyze adjacent fracture pixels to identify fracture intersections and fracture end-points.

In Block 420, a fracture model is determined using various fractures, an artificial neural network, and borehole image data in accordance with one or more embodiments. For example, borehole image logs may be obtained during drilling of a well via a well logging operation or post-drilling via a wireline logging operation. The borehole image data may be used as inputs to an artificial neural network for determining local fractures within a geological region. Using fractures identified from fracture image data and borehole image data, a fracture model may be generated that identifies the location of fractures. For example, the fracture model may be a discrete fracture model, and the artificial neural network may be a U-Net model. Thus, the fracture model from the borehole image data may be determined using a similar process as the fracture determined using the fracture image data with the main difference being the image source.

In Block 430, various fracture permeability values are determined using a fracture model and an artificial neural network in accordance with one or more embodiments. To estimate fractures hydraulic properties, a fracture model based on borehole image data and other image data (e.g., photographic images of extracted cores from wells) is used. As such, fracture permeability may be determined for fractures throughout the fracture model, e.g., using upscaling through machine learning. In some embodiments, for example, a fracture model may be divided into various fracture profiles (e.g., a slice of a geological region that includes one or more fractures) that used as inputs to a convolutional neural network (CNN) model. The output of the CNN model may be fracture permeability values for different fracture regions of the geological region of interest. A similar process may be performed to determine other hydraulic fracture properties, such as porosity.

In Block 440, various rock matrix permeability values are determined for a geological region of interest using core sample data in accordance with one or more embodiments. For example, rock matrix permeability values may be estimated from various core sample data. In some embodiments, the core sample data includes micro-computed tomography (micro-CT) images. Likewise, matrix hydraulic properties may also be obtained through other types of core analysis, such as permeameter probe measurements or T2 NMR tests.

In Block 450, a coarsened grid model is generated for a geological region of interest using an artificial neural network, various rock matrix permeability values, and various fracture permeability values in accordance with one or more embodiments. Using permeability values from the fractures and rock matrix, a coarsened grid model may be populated with various geological and reservoir properties for the geological region of interest. Using fracture permeability values and matrix permeability values, for example, another artificial neural network may be used to obtain equivalent absolute permeability tensors for the entire geological region of interest. The artificial neural network may be a convolutional neural network that is part of a CNN-based workflow, for example. Thus, the coarsened grid model may provide an upscaled geological model for use in various simulations. In some embodiments, a coarsened grid model is a dual-porosity model of a reservoir.

In Block 460, upscaled multiphase flow data are determined for a geological region of interest using an artificial neural network in accordance with one or more embodiments. In some embodiments, for example, the upscaled multiphase flow data may include equivalent two-phase (e.g., oil and water) effective properties in the coarsened grid model. Example properties may include phase effective permeability, saturation data, and capillary pressure data. Accordingly, a pre-trained CNN model may be used to predict the upscaled multiphase flow data using model data from the coarsened grid model.

In some embodiments, fracture-fracture transmissibility values are upscaled using a coarsened grid model. For example, where two coarsened grid blocks have connected fractures, a steady-state single-phase flow problem with the imposed boundary conditions may be solved accordingly. Using a straightforward two-point finite-volume method, may be determined based on fine-scale solutions. As such, an upscaled fracture-fracture transmissibility may be determined using the following equation:

$$T_{k-l} = \frac{Q_{k-l}\mu}{(\overline{p_k} - \overline{p_l})\overline{\rho}} \quad \text{Equation 1}$$

where $T_{k-l}$ corresponds to an upscaled fracture-fracture transmissibility value for adjacent grid blocks k and l, $\overline{p}$ corresponds to a mean pressure for grid blocks k or l, $\overline{\rho}$ corresponds to a mean fluid density value within each grid block, $Q_{k-l}$ corresponds to a mass flow rate through a fracture-fracture interface, and $\mu$ is a permeability value.

For some coarsened grid blocks with disconnected fractures, overall permeability of coarsened grid block may be enhanced by a fracture or a block-to-block flow. This effect may be captured using the upscaled transmissibility $T_{k-l}$ on Equation 1. An equivalent fracture-fracture transmissibility may be determined using a grid matrix that determines a flow between two adjacent grid blocks.

In some embodiments, upscaled data is determined for a matrix-fracture and -matrix upscaled transmissibility values. For example, a flow-based sub-gridding technique may be used quantify the communication between the matrix and fractures as well as transient effects occurring within each coarse grid block. To determine the internal connections, some embodiments use the following equation to determine the transient-state compressible single-phase flow problem for the coarse block k:

$$\phi c \frac{\partial p}{\partial t} = \nabla \cdot \left(\frac{k}{\mu}\nabla p\right) \quad \text{Equation 2}$$

where $\phi$, c, p, k, $\mu$ are porosity, compressibility, pressure, viscosity, and permeability, respectively. Equation 2 may be solved inside each coarse block with no-flux boundary conditions imposed on the respective grid block and a fixed injection rate within the fracture networks. The no-flux boundary conditions may be based on connections regarding matrix-matrix and matrix-fracture being localized within each coarse grid block; i.e., no exchange between adjacent blocks occurs through the matrix. Equation 2 may be iteratively resolved until the pseudo-steady state is achieved, in which the term $\partial p/\partial t$ may be constant. In this case, the solutions of Equation 2 may be equivalent to the solutions of the following steady-state, incompressible flow equation:

$$\nabla \cdot \left(\frac{k}{\mu}\nabla p\right) = q \quad \text{Equation 3}$$

where q corresponds to a source term (e.g., q=1 may be designated in some embodiments). No-flux boundary conditions may be applied on all block sides, and fixed pressure values inside the fracture networks, i.e., fractures here serve as producer wells. Solving Equation 3 may be more computationally efficient than Equation 2 because of the avoidance of time stepping issues. Multiple sub-regions may be determined using iso-pressure contours based on the fine-scale solutions from Equation 3.

Mean pressure may be then determined within two adjacent sub-regions (denoted as $\overline{p_{k,i}}$ and $\overline{p_{k,i+1}}$) and the mass flow rates through the contour lien between them (i.e., $\overline{Q_{k,i \leftrightarrow i+1}}$). Thus, a matrix-matrix transmissibility and matrix-fracture upscaled transmissibility may be determined via Equation 1. In other words, for isolated coarsened grid blocks, Equation 3 may be solved with no-flux boundary conditions and fixed pressure values inside the fractures. Afterwards, various mean sub-region pressures and corresponding flow rate are determined for use in determining matrix-matrix and matrix-fracture transmissibility values.

In Block 470, a multiphase simulation model is determined based on a coarsened grid model and upscaled multiphase flow data in accordance with one or more embodiments. After generating upscaled multiphase flow data, a multiphase simulation model may be determined accordingly for running various reservoir simulations. In some embodiments, the multiphase simulation model provides an upscaled model that is computationally more efficient that field-scale numerical computations of unstructured discrete fractures. Thus, the multiphase simulation model may be used to perform various field-scale applications. Examples of improved field applications includes determining transmissibility where formations contain extensive vuggs or caves, or where fractures act as flow baffles, i.e., faults are filled with minerals or in clay-rich sandstone formations.

Figure 5:
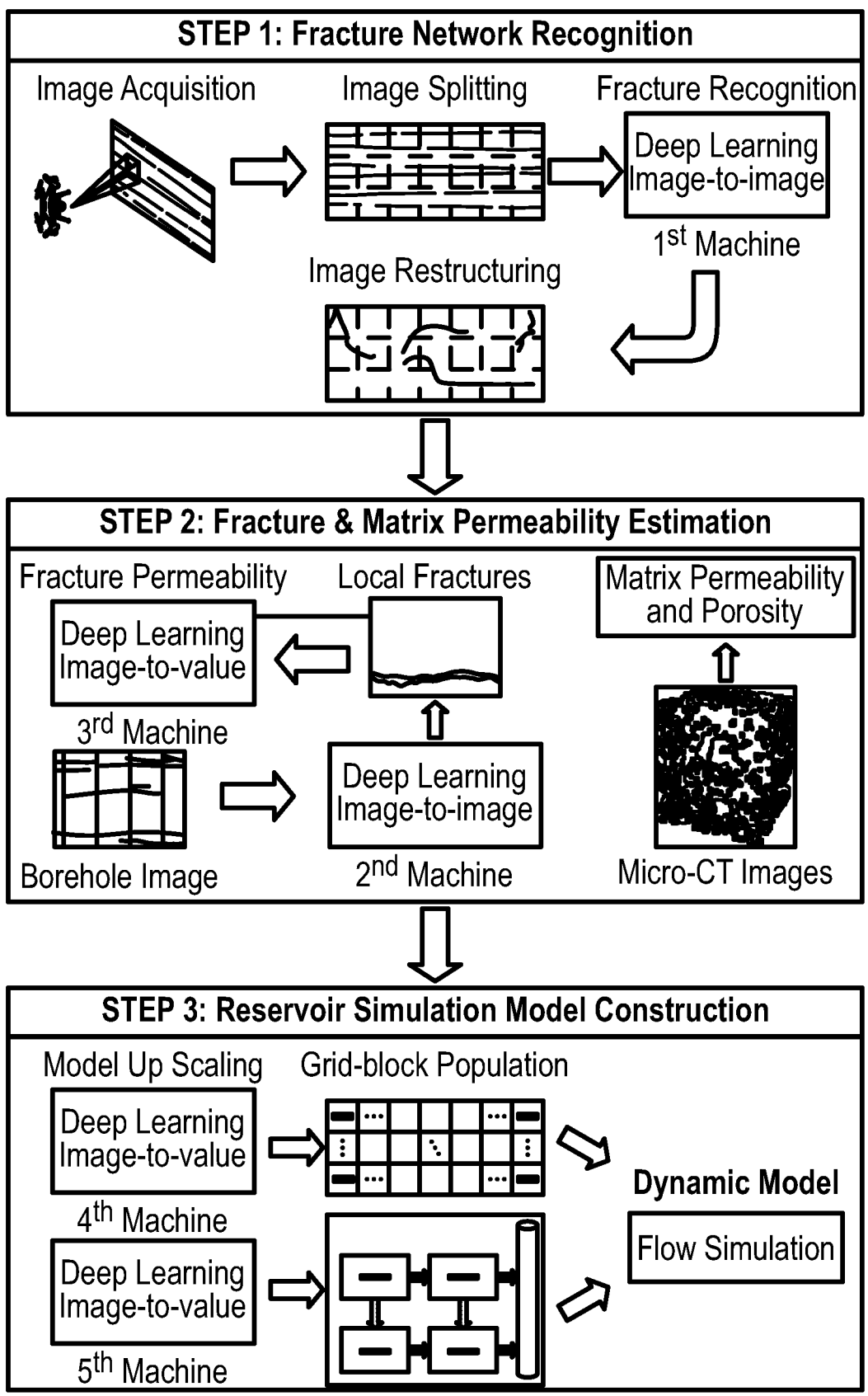
FIG. 5 shows an example in accordance with one or more embodiments.

Turning to FIG. 5, FIG. 5 provides an example of generating a multiphase simulation model using multiple artificial neural networks. In FIG. 5, an upscaling workflow is shown starts with the high-fidelity image of a discrete fracture model as an input. In Step 1 of FIG. 5, fracture network recognition is automatized through a detection process using actual outcrop images instead of human labeling and mapping work (which typically are labor-intensive and subjective). A U-Net model is the first machine in FIG. 5, which is used to recognize fracture-occupied pixels from matrix-occupied pixels. Thus, fracture and matrix pixels are represented by 1 and 0, respectively. Keeping with Step 1, a pixel-searching algorithm is used to detect the fracture networks by linking the intersection and end-points of fractures.

Turning to step 2 of FIG. 5, fracture and matrix permeability values are determined using an automatic process that is applied to borehole images (BHI) and micro-CT images, respectively. Regarding fracture permeability upscaling, two machines are implemented in this step. Another U-Net model (i.e., second machine) is used to identify the fracture profile from the BHIs following step 1. Afterwards, the output is fed into a convolutional neural network (CNN) model (i.e., the third machine) with the identified fracture profile to estimate the corresponding fracture permeability. For the training the CNN model, high-fidelity Navier-Stokes simulations may be used to generate the train-validation datasets.

Turning to step 3 of FIG. 5, reservoir simulation model construction is performed using a discrete fracture model (DFM) featuring information from step 1 and step 2. Within the CNN implementation (i.e., the fourth machine), a nonlinear relationship is mapped between the high-fidelity image of detailed DFM (i.e., input) and the upscaled equivalent-continuum model (i.e., output) based on an image-to-value model. The equivalent continuum model may include the predicted equivalent permeability tensor of each coarsened grid block. Here, the upscaled model within the fourth machine models single-phase flow in fractured reservoirs. Accordingly, another CNN-based model (i.e., the fifth machine) is introduced to perform an upscaling workflow for the modeling of two-phase flow in fractured media. A CNN-based image-to-value model is then established to model the nonlinear mapping between the high-fidelity image of detailed DFM and the upscaled multiphase simulation model.

In Block 480, a hydraulic stimulation operation is determined for a geological region of interest using a multiphase simulation model in accordance with one or more embodiments. Based on one or more hydraulic stimulation simulations using a multiphase simulation model, one or more stimulation parameters may be adjusted to achieve one or more desired reservoir enhancements.

In Block 490, a hydraulic stimulation operation is performed in accordance with one or more embodiments. For example, a well completion system may be used to perform the hydraulic stimulation operation from Block 480.

Figure 6:
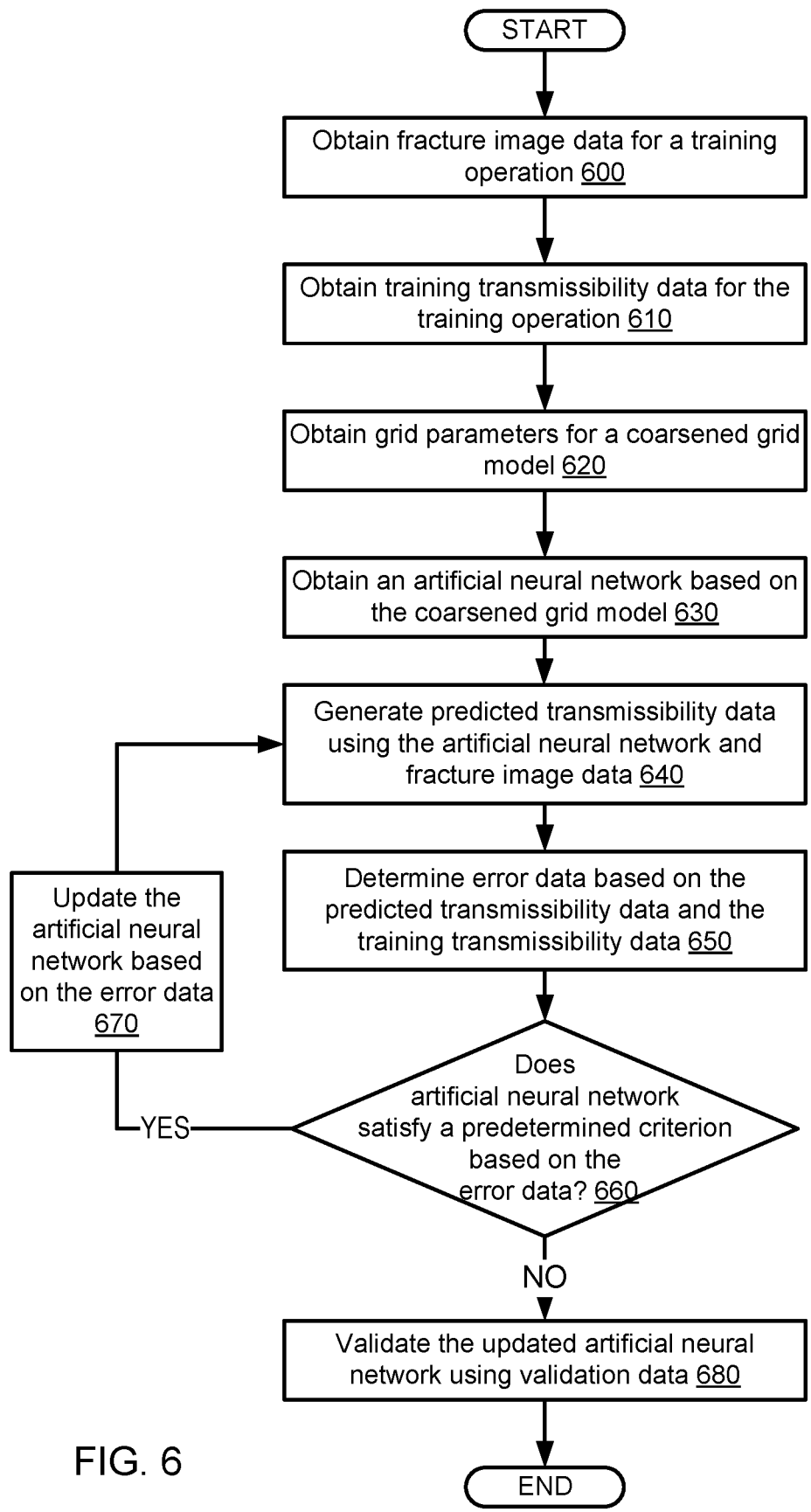
FIG. 6 shows a flowchart in accordance with one or more embodiments.

Turning to FIG. 6, FIG. 6 shows a flowchart in accordance with one or more embodiments. Specifically, FIG. 6 describes a general method for generating an artificial neural network for predicting multiphase flow data. One or more blocks in FIG. 6 may be performed by one or more components (e.g., reservoir simulator (160)) as described in FIGS. 1, 2A, 2B, 3A, and 3B. While the various blocks in FIG. 6 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 600, fracture image data is obtained for a training operation in accordance with one or more embodiments. When designing the dataset, the fracture data may capture different fracture network configurations in the reservoir. For example, various fracture network parameters may be varied such as fracture length, number of fractures, fracture angles, and fracture intersections. The fracture data may also reflect one or more dominant flow transfers in the reservoir. For example, for a fracture cutting through adjacent blocks, flow in a cross cutting fracture may dominate over flow between matrix blocks due to a high permeability in the fracture in comparison to the rock matrix. For diffused fracture networks, flow between two adjacent blocks may occur through their matrix while fractures may enhance matrix permeability. In some embodiments, the fracture image data is similar to the fracture image data described above in Block 400 in FIG. 4 and the accompanying description.

In some embodiments, training images may be converted into a lower resolution based on an accuracy-efficiency analysis. The image coarsening process may speed up the feature-extraction and training-validating processes. By determining an optimum resolution for training images, the training operation may characterize the fracture-network patterns without losing significant prediction accuracy. For example, training images may have 2000×1000 and 1000×1000 pixel-resolution on adjacent and isolated blocks, respectively. These coarse binary images will be used as input to train the CNN model.

In Block 610, training transmissibility data is obtained for a training operation in accordance with one or more embodiments. For example, the output data of an artificial neural network may be transmissibility (Tk), e.g., transmissibility data of an embedded fracture image. To calculate the transmissibility, a fine-grid model may be applied to the fracture image to get an embedded discrete fracture network (EDFM) for the fracture emodel. Afterwards, the EDFM may be solved using a straightforward two-point flux approximation (TPFA) finite-volume method implemented within simulation software. Likewise, the validation dataset may include output transmissibility data representing the ground truth data for evaluating the accuracy of CNN model predictions.

In some embodiments, an artificial neural network is trained using a training dataset that includes human-picked data, augmented data, and/or synthetic data. For example, data augmentation may include performing various processes on acquired fracture image data, such as log cropping or adding noise, in order to generate augmented fracture image data. In particular, data augmentation may introduce various machine-learning algorithms to uncommon problems in order to increase a trained model's ability to predict transmissibility data or permeability data. Likewise, data augmentation may be performed in order to generate an extended dataset sufficient to train a model. Example data augmentation operations may include random null operations that randomly assign a zero value, random shifting operations that shift a range of data values within the data, masking data, and/or rotating data. While some of data augmentation operations are described as being random, the data augmenting processes may include pseudorandom processes tailored to specific criteria.

In Block 620, various grid parameters are obtained for a coarsened grid model in accordance with one or more embodiments. Using the grid parameters for a desired coarsened grid model, various input layers and output layers of an artificial network may be configured accordingly. For example, grid parameters may determine how many outputs are generated for different grid blocks, such as for upscaled multiphase flow data. Likewise, grid parameters may determining the gridding for a gridded fracture image. Thus, grid parameters may specify the size of grid blocks, the number of grid blocks, the number of model layers, and other model parameters for a grid model.

In Block 630, an artificial neural network is obtained based on a coarsened grid model in accordance with one or more embodiments. For example, an initial model may be obtained and initialized with weights and/or biases prior to a training operation. In particular, the machine learning model may be capable of approximating solutions of complex non-linear problems. Various types of neural networks are contemplated, such a deep neural network with three or more hidden layers, a convolutional neural network, and various other types of neural networks, such as a U-Net model. In some embodiments, the machine-learning model is pre-trained for the geological region of interest. For example, some training operations may benefit from "transfer learning" between models trained using similar problems with different training datasets. For more information on machine-learning models such as artificial neural networks, see FIG. 1 above and the accompanying description.

In Block 640, predicted transmissibility data is generated using an artificial neural network and fracture image data in accordance with one or more embodiments. For example, an artificial neural network may predict fracture-fracture transmissibility data for adjacent course blocks from a gridded fracture image. For isolated coarsened grid blocks, an artificial neural network may also use a gridded fracture image to predict fracture-matrix transmissibility values.

In Block 650, error data are determined based on predicted transmissibility data and training transmissibility data in accordance with one or more embodiments. For example, the prediction part of a machine-learning algorithm may be used to test the accuracy of a trained model. A portion of a machine-learning epoch's batch may then be used at this point for verifying the validity of the trained artificial neural network. This non-predicted data is then compared with the predicted transmissibility data to determine the difference or amount of data error. Depending on the amount of data error, a learning rate of the model may be adjusted.

In Block 660, a determination is made whether an artificial neural network satisfies a predetermined criterion based on error data in accordance with one or more embodiments. For example, the predetermined criterion may be a predetermined degree of accuracy or a set number of machine-learning epochs to be completed during a training operation. Thus, a machine-learning algorithm may obtain a user input regarding the predetermined criterion for use in the model training. Likewise, depending on the amount of data error determined in Block 650, the machine-learning algorithm may automatically determine that the model is done training. When a determination is made that another machine-learning epoch is to be performed on the model, the process may proceed to Block 670. When a determination is made that the model is done training, the process may return to Block 680.

In some embodiments, an artificial neural network is trained using multiple epochs. For example, an epoch may be an iteration of a model through a portion or all of a training dataset. As such, a single machine-learning epoch may correspond to a specific batch of training data, where the training data is divided into multiple batches for multiple epochs. Thus, a machine-learning model may be trained iteratively using epochs until the model achieves a predetermined level of prediction accuracy. Thus, better training of a model may lead to better predictions by a trained model.

In Block 670, an artificial neural network is updated based on error data in accordance with one or more embodiments. During a training operation, the artificial neural network may be updated using one or more types of machine-learning algorithms, such as a supervised algorithm. In supervised learning, the trained model may be updated using a gradient-based optimization (e.g., a stochastic gradient descent process) to update weights and biases within the model such that a misfit between predicted transmissibility data and actual transmissibility data (i.e., ground truth data based on a fine-grid model) is minimized.

In Block 680, an updated artificial neural network is validated using validation data in accordance with one or more embodiments. Here, a final model from a training operation may be evaluated prior to use in production and inference operations.

Figure 7:
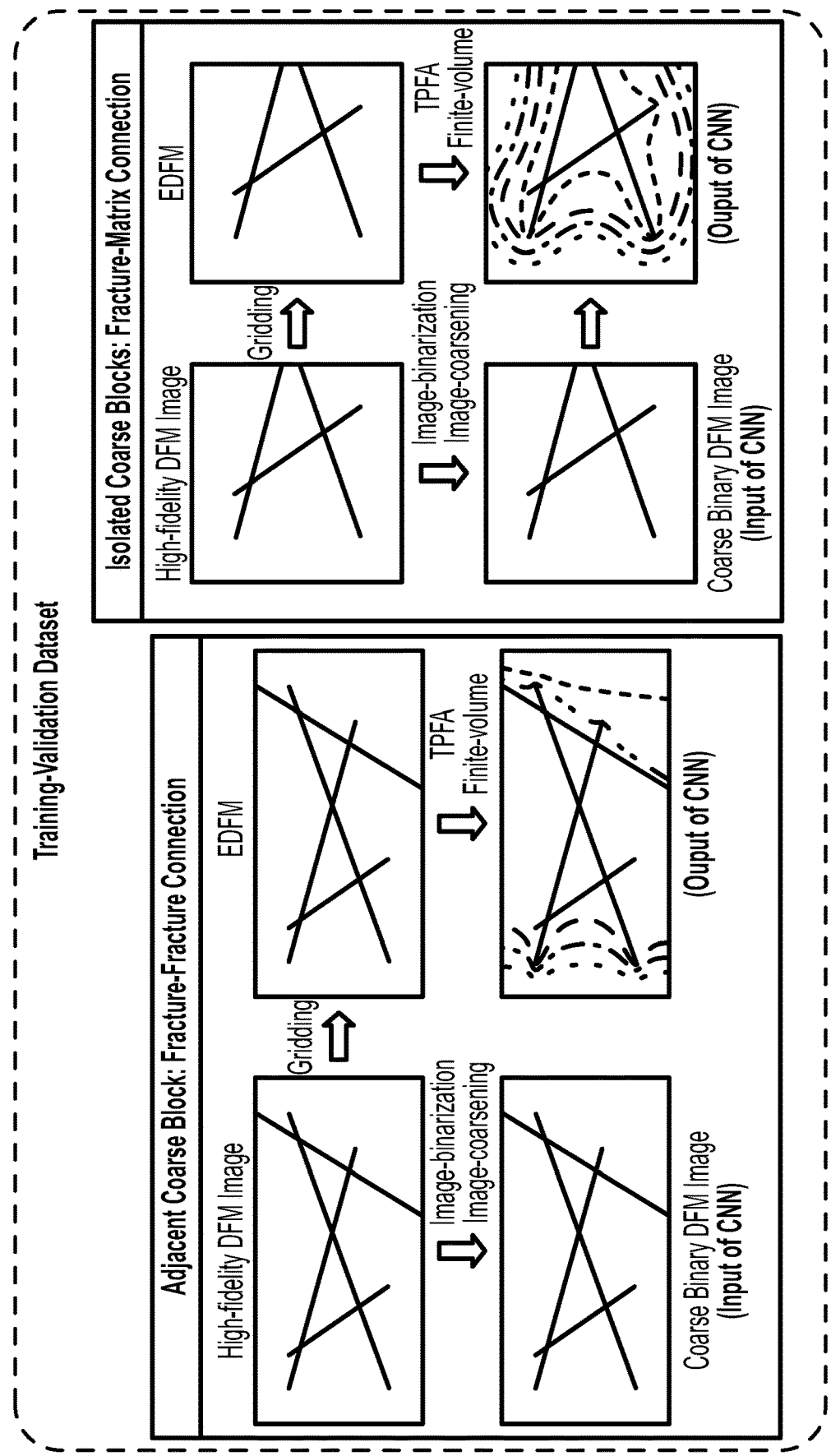
FIGS. 7 and 8 show examples in accordance with one or more embodiments.

Turning to FIG. 7, FIG. 7 shows a training dataset in accordance with one or more embodiments. In FIG. 7, a training-validation dataset is used in a training operation for a deep learning CNN model. Here, the training-validation dataset includes two types of data to capture the physics and geology in a fractured reservoir, i.e., fracture-fracture data and fracture-matrix connection data. Such fracture connections may be used to capture flow transfers in a reservoir grid model. In the training operation workflow, an optimum grid-block size may be determined for generated data, such as through a grid sensitivity analysis. Different configurations of fracture models may be generated using various space-filling image augmentation techniques. As shown in FIG. 7, images a-d correspond to a dataset that is designed to capture fracture-fracture connections within adjacent blocks while images e-h correspond to fracture-matrix connectivity inside isolated blocks. Initially, various high-fidelity images of a DFM are pre-processed using an image-binarizing, image-coarsening process to generate the input data for the CNN model. Afterwards, an output is determined by applying the TPFA finite-volume scheme based on EDFM. The whole process may be automated until sufficient training datasets and validation datasets are generated.

Keeping with FIG. 7, a 2D porous media of dimensions is shown 100 m×100 m dimensions and a fracture along the diagonal direction. Here, the domain is initially saturated with oil, while an injector and a producer are located at the lower-left and upper-right corners, respectively. The EDFM and DFM implementations are gridded to a structured and triangular mesh, respectively, such that each mesh includes 5000 meshes. The fine-scale solutions solved by EDFM-based and DFM-based a two-point flux approximation (TPFA) scheme may be compared within the framework. Results show that EDFM-based TPFA has an essential match with the DFM-based DFM for both a Sw profile and an oil recovery curve yet has more computational efficiency. Consequently, an EDFM-based TPFA scheme to solve two-phase flow problems as the reference fine-scale solutions.

Figure 8:
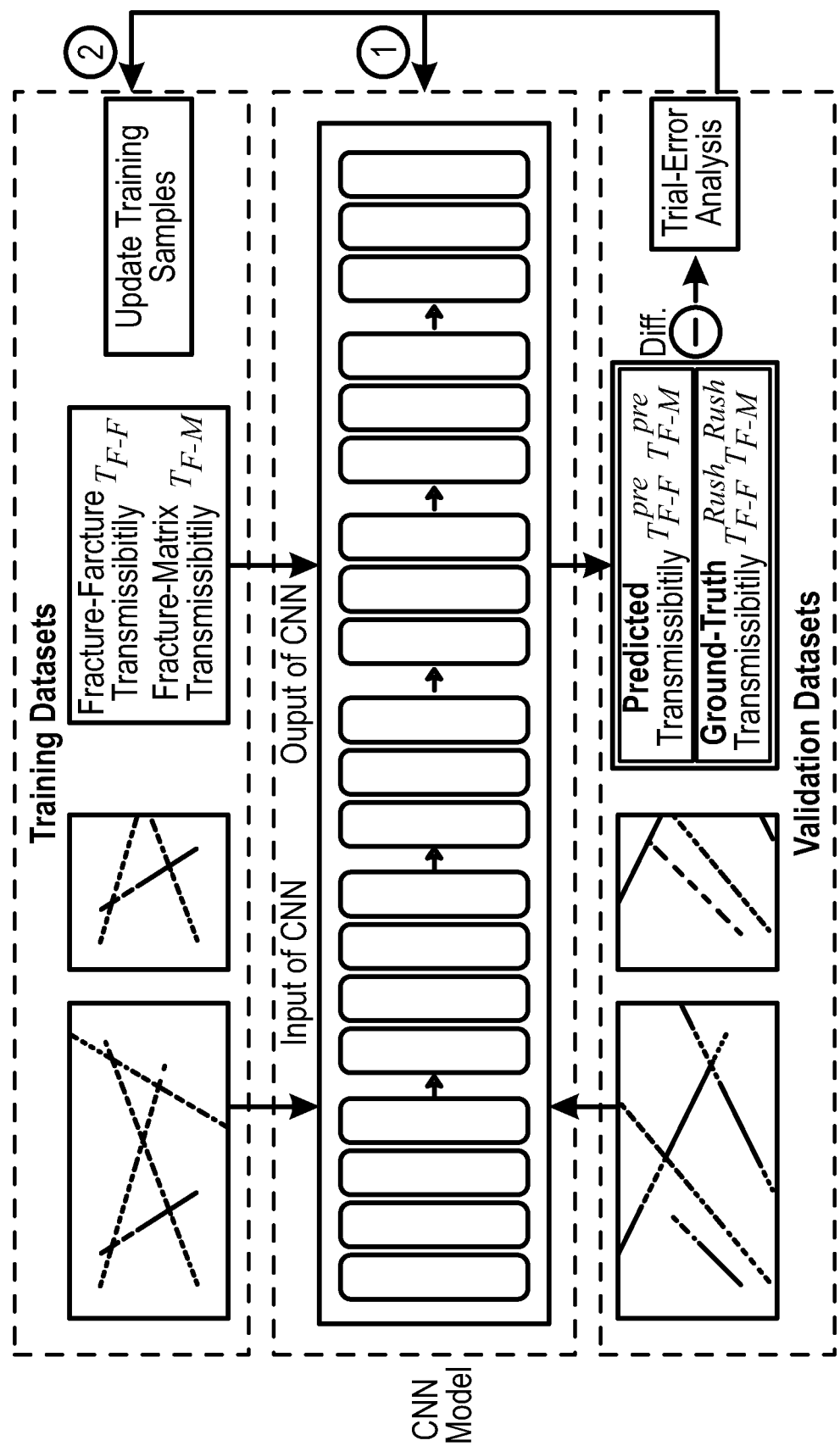

Turning to FIG. 8, FIG. 8 illustrates a training operation in accordance with one or more embodiments. As shown in FIG. 8, various training-validation datasets are generated for a CNN model. Using the coarse binary DFM image as an input, the CNN model is trained to predict the transmissibility (i.e., the output) with at least 90% accuracy using a back-propagation algorithm. At fixed intervals during the training process, accuracy of the CNN model may be checked using the validation dataset. Specifically, the CNN model is fed with input images from validation dataset. Then, the CNN model's predictions of transmissibility may be compared against output transmissibility from validation dataset. A trial-error analysis may be performed using the discrepancy between CNN predictions and validation dataset obtained in a previous iteration.

Figure 9:
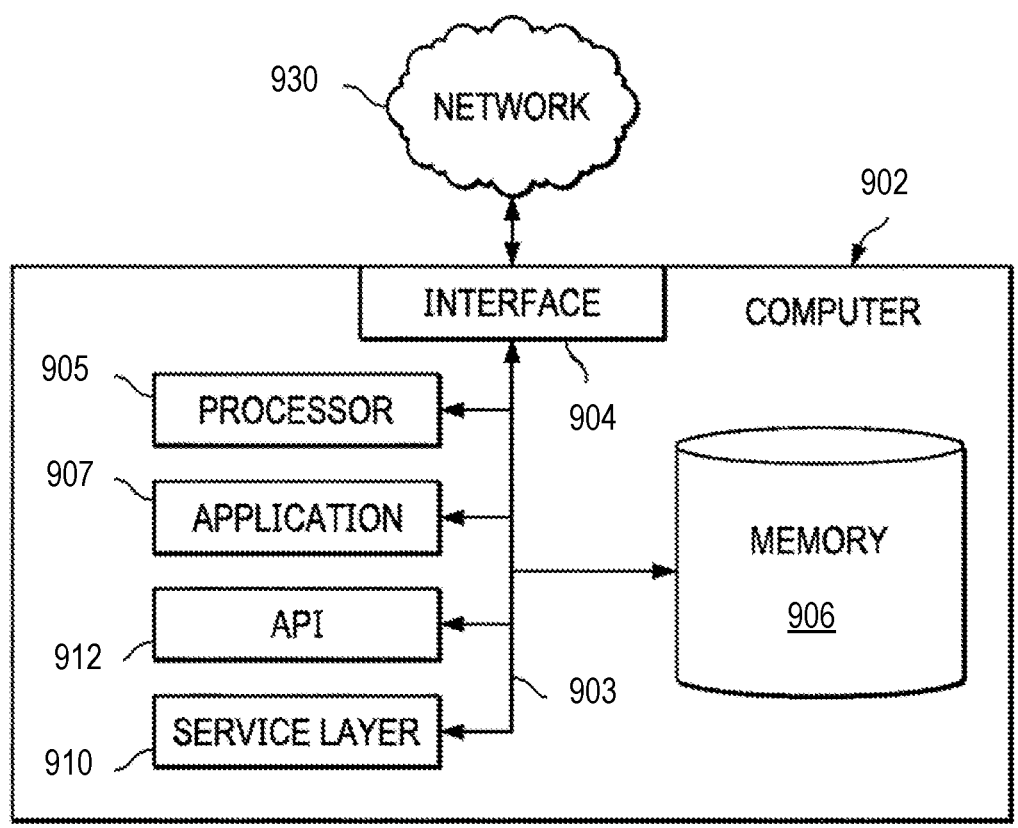
FIG. 9 shows a computer system in accordance with one or more embodiments.

Embodiments may be implemented on a computer system. FIG. 9 is a block diagram of a computer system (902) used to provide computational functionalities associated with described algorithms, methods, functions, processes, flows, and procedures as described in the instant disclosure, according to an implementation. The illustrated computer (902) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (902) may include a computer that includes an input device, such as a keypad, keyboard, touch screen, or other device that can accept user information, and an output device that conveys information associated with the operation of the computer (902), including digital data, visual, or audio information (or a combination of information), or a GUI.

The computer (902) can serve in a role as a client, network component, a server, a database or other persistency, or any other component (or a combination of roles) of a computer system for performing the subject matter described in the instant disclosure. The illustrated computer (902) is communicably coupled with a network (930). In some implementations, one or more components of the computer (902) may be configured to operate within environments, including cloud-computing-based, local, global, or other environment (or a combination of environments).

At a high level, the computer (902) is an electronic computing device operable to receive, transmit, process, store, or manage data and information associated with the described subject matter. According to some implementations, the computer (902) may also include or be communicably coupled with an application server, e-mail server, web server, caching server, streaming data server, business intelligence (BI) server, or other server (or a combination of servers).

The computer (902) can receive requests over network (930) from a client application (for example, executing on another computer (902)) and responding to the received requests by processing the said requests in an appropriate software application. In addition, requests may also be sent to the computer (902) from internal users (for example, from a command console or by other appropriate access method), external or third-parties, other automated applications, as well as any other appropriate entities, individuals, systems, or computers.

Each of the components of the computer (902) can communicate using a system bus (903). In some implementations, any or all of the components of the computer (902), both hardware or software (or a combination of hardware and software), may interface with each other or the interface (904) (or a combination of both) over the system bus (903) using an application programming interface (API) (912) or a service layer (913) (or a combination of the API (912) and service layer (913). The API (912) may include specifications for routines, data structures, and object classes. The API (912) may be either computer-language independent or dependent and refer to a complete interface, a single function, or even a set of APIs. The service layer (913) provides software services to the computer (902) or other components (whether or not illustrated) that are communicably coupled to the computer (902). The functionality of the computer (902) may be accessible for all service consumers using this service layer. Software services, such as those provided by the service layer (913), provide reusable, defined business functionalities through a defined interface. For example, the interface may be software written in JAVA, C++, or other suitable language providing data in extensible markup language (XML) format or other suitable format. While illustrated as an integrated component of the computer (902), alternative implementations may illustrate the API (912) or the service layer (913) as stand-alone components in relation to other components of the computer (902) or other components (whether or not illustrated) that are communicably coupled to the computer (902). Moreover, any or all parts of the API (912) or the service layer (913) may be implemented as child or sub-modules of another software module, enterprise application, or hardware module without departing from the scope of this disclosure.

The computer (902) includes an interface (904). Although illustrated as a single interface (904) in FIG. 9, two or more interfaces (904) may be used according to particular needs, desires, or particular implementations of the computer (902). The interface (904) is used by the computer (902) for communicating with other systems in a distributed environment that are connected to the network (930). Generally, the interface (904 includes logic encoded in software or hardware (or a combination of software and hardware) and operable to communicate with the network (930). More specifically, the interface (904) may include software supporting one or more communication protocols associated with communications such that the network (930) or interface's hardware is operable to communicate physical signals within and outside of the illustrated computer (902).

The computer (902) includes at least one computer processor (905). Although illustrated as a single computer processor (905) in FIG. 9, two or more processors may be used according to particular needs, desires, or particular implementations of the computer (902). Generally, the computer processor (905) executes instructions and manipulates data to perform the operations of the computer (902) and any algorithms, methods, functions, processes, flows, and procedures as described in the instant disclosure.

The computer (902) also includes a memory (906) that holds data for the computer (902) or other components (or a combination of both) that can be connected to the network (930). For example, memory (906) can be a database storing data consistent with this disclosure. Although illustrated as a single memory (906) in FIG. 9, two or more memories may be used according to particular needs, desires, or particular implementations of the computer (902) and the described functionality. While memory (906) is illustrated as an integral component of the computer (902), in alternative implementations, memory (906) can be external to the computer (902).

The application (907) is an algorithmic software engine providing functionality according to particular needs, desires, or particular implementations of the computer (902), particularly with respect to functionality described in this disclosure. For example, application (907) can serve as one or more components, modules, applications, etc. Further, although illustrated as a single application (907), the application (907) may be implemented as multiple applications (907) on the computer (902). In addition, although illustrated as integral to the computer (902), in alternative implementations, the application (907) can be external to the computer (902).

There may be any number of computers (902) associated with, or external to, a computer system containing computer (902), each computer (902) communicating over network (930). Further, the term "client," "user," and other appropriate terminology may be used interchangeably as appropriate without departing from the scope of this disclosure. Moreover, this disclosure contemplates that many users may use one computer (902), or that one user may use multiple computers (902).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed:

1. A method, comprising:
obtaining, by a computer processor, fracture image data regarding a geological region of interest;
determining, by the computer processor, a plurality of fractures in the fracture image data using a first artificial neural network and a pixel-searching process;
determining, by the computer processor, a fracture model using the plurality of fractures, a second artificial neural network, and borehole image data;
determining, by the computer processor, a plurality of fracture permeability values using the fracture model and a third artificial neural network;
determining, by the computer processor, a plurality of matrix permeability values for the geological region of interest using core sample data;
generating, by the computer processor, a coarsened grid model for the geological region of interest using a fourth artificial neural network, the plurality of matrix permeability values, and the plurality of fracture permeability values;
determining, by the computer processor, upscaled multiphase flow data for the geological region of interest using a fifth artificial neural network;
generating, by the computer processor, a multiphase simulation model based on the coarsened grid model and the upscaled multiphase flow data;
determining, using the coarsened grid model a stimulation treatment for one or more fractures in the geological region of interest, wherein the stimulation treatment comprises an injection fluid pressure and a predetermined type of proppant; and
performing the stimulation treatment in a wellbore.

2. The method of claim 1,
wherein the upscaled multiphase flow data comprise effective permeability data, saturation data, and capillary pressure data,
wherein the fifth artificial neural network is a convolutional neural network model that predicts a plurality of oil-phase property values and a plurality of water-phase property values within a grid block based on an input grid model and one or more input fracture permeabilities.

3. The method of claim 2,
wherein the plurality of oil-phase property values and the plurality of water-phase property values comprise fracture-fracture transmissibility data and fracture-matrix transmissibility data.

4. The method of claim 1, further comprising:
performing a micro-computed tomography (micro-CT) process to one or more core samples to generate micro-CT image data,
wherein the one or more core samples are acquired from one or more wellbores in the geological region of interest, and
wherein the core sample data comprise the micro-CT image data.

5. The method of claim 1, further comprising:
obtaining outcrop image data regarding the geological region of interest,
wherein the outcrop image data comprises a fracture image that is acquired using one or more vertical photography processes, and
wherein the fracture image data comprises the outcrop image data.

6. The method of claim 1, further comprising:
determining, using the first artificial neural network, a plurality of fracture-occupied pixels in the fracture image data, wherein the first artificial neural network is a U-Net model that predicts fracture-occupied pixels from an input image;
generating, using the pixel-searching process and the plurality of fracture-occupied pixels, a fracture model for the geological region of interest, and
wherein the pixel-searching process determines fracture intersections and fracture end-points based on the plurality of fracture-occupied pixels.

7. The method of claim 1, further comprising:
determining, using the second artificial neural network, a plurality of predicted fractures within the borehole image data, wherein the second artificial neural network is a U-Net model that predicts fractures from an input image, and
wherein the fracture model comprises the plurality of predicted fractures.

8. The method of claim 1,
wherein the third artificial neural network is a convolutional neural network model that predicts fracture permeability from an input fracture model, and
wherein the fracture model comprises a fracture profile that is a two-dimensional image of fractures within a slice of the geological region of interest.

9. The method of claim 1, further comprising:
determining, using the fourth artificial neural network, a plurality of permeability tensors that correspond to a plurality of grid blocks within the coarsened grid model,
wherein the fourth artificial neural network is a convolutional neural network model that predicts a permeability value within a grid block based on an input grid model and one or more input fracture permeabilities.

10. A system, comprising:
a logging system coupled to a plurality of logging tools;
a well completion system coupled to a wellbore and a reservoir simulator; and
the reservoir simulator comprising a computer processor, wherein the reservoir simulator is coupled to the logging system, the reservoir simulator comprising functionality for:
obtaining first fracture image data regarding a geological region of interest;
determining a plurality of fractures in the first fracture image data using a first artificial neural network and a pixel-searching process;
determining a fracture model using the plurality of fractures, a second artificial neural network, and borehole image data;
determining a plurality of fracture permeability values using the fracture model and a third artificial neural network;
determining a plurality of matrix permeability values for the geological region of interest using core sample data;
generating a coarsened grid model for the geological region of interest using a fourth artificial neural network, the plurality of matrix permeability values, and the plurality of fracture permeability values;
determining, using the coarsened grid model a stimulation treatment for one or more fractures in the geological region of interest, wherein the stimulation treatment comprises an injection fluid pressure and a predetermined type of proppant;

determining upscaled multiphase flow data for the geological region of interest using a fifth artificial neural network; and generating a multiphase simulation model based on the coarsened grid model and the upscaled multiphase flow data, wherein the well completion system is configured to perform the stimulation treatment in the wellbore.

11. The system of claim 10, wherein the reservoir simulator further comprises functionality for:

performing a micro-computed tomography (micro-CT) process to one or more core samples that are acquired using the logging system to generate micro-CT image data, wherein the one or more core samples are acquired from a wellbore coupled to the logging system and in the geological region of interest, and wherein the core sample data comprise the micro-CT image data.

12. The system of claim 10, wherein the reservoir simulator further comprises functionality for:

obtaining second fracture image data;

obtaining training transmissibility data regarding at least one fracture-fracture connection and a fracture-matrix connection; and generating the fifth artificial neural network using a plurality of machine-learning epochs, the second fracture image data, the training transmissibility data, and predicted transmissibility data.

\* \* \* \* \*